United States Patent
Grudin et al.

(10) Patent No.: US 8,847,117 B2
(45) Date of Patent: Sep. 30, 2014

(54) METHOD OF STABILIZING THERMAL RESISTORS

(75) Inventors: Oleg Grudin, Montreal (CA); Yougui Liao, Evanston, IL (US); Leslie M. Landsberger, Montreal (CA); Gennadiy Frolov, Montreal (CA); Lyudmila Grudina, Montreal (CA); Gerald Arzoumanian, Laval des Rapides (CA); Saed Salman, Verdun (CA); Tommy Tsang, Scarborough (CA); Bowei Zhang, Brossard (CA)

(73) Assignee: Sensortechnics GmbH, Puchheim (DE)

( * ) Notice: Subject to any disclaimer, the term of this patent is extended or adjusted under 35 U.S.C. 154(b) by 638 days.

(21) Appl. No.: 12/920,801

(22) PCT Filed: Mar. 16, 2009

(86) PCT No.: PCT/CA2009/000320
§ 371 (c)(1),
(2), (4) Date: Mar. 21, 2011

(87) PCT Pub. No.: WO2009/111890
PCT Pub. Date: Sep. 17, 2009

(65) Prior Publication Data
US 2011/0220631 A1    Sep. 15, 2011

Related U.S. Application Data

(60) Provisional application No. 61/036,597, filed on Mar. 14, 2008.

(51) Int. Cl.
| | | |
|---|---|---|
| *F23Q 7/00* | (2006.01) |
| *B23H 5/00* | (2006.01) |
| *B23K 15/02* | (2006.01) |
| *H05B 1/02* | (2006.01) |
| *H05B 3/02* | (2006.01) |
| *H01C 10/00* | (2006.01) |
| *H01C 17/00* | (2006.01) |
| *H05B 3/00* | (2006.01) |
| *H01C 7/04* | (2006.01) |
| *B60L 1/02* | (2006.01) |
| *A22C 7/00* | (2006.01) |
| *A47J 39/00* | (2006.01) |
| *H01L 49/02* | (2006.01) |
| *H01C 17/22* | (2006.01) |
| *H01C 17/26* | (2006.01) |

(52) U.S. Cl.
CPC ............... *H01L 28/20* (2013.01); *H01C 17/22* (2013.01); *H01C 17/265* (2013.01)
USPC ............ 219/262; 219/68; 219/482; 219/483; 219/488; 219/489; 219/490; 219/507; 338/195; 29/610.1; 29/611; 29/612; 290/2; 99/442; 99/428; 99/439; 99/426; 99/448

(58) Field of Classification Search
USPC .................. 219/68, 260, 262–264, 268, 482, 219/484–486, 488–490, 492, 494, 497, 501, 219/507; 338/195; 29/610.1, 611.12; 99/442, 428, 439, 426, 448; 290/2; 123/60.1
See application file for complete search history.

(56) References Cited

U.S. PATENT DOCUMENTS

| | | | | |
|---|---|---|---|---|
| 3,723,257 A | * | 3/1973 | Bhattacharyya | 205/118 |
| 3,916,142 A | * | 10/1975 | Ennis | 219/121.69 |
| 4,210,996 A | * | 7/1980 | Amemiya et al. | 29/610.1 |
| 4,420,766 A | * | 12/1983 | Kasten | 365/103 |
| 4,472,239 A | * | 9/1984 | Johnson et al. | 438/49 |
| 4,714,911 A | * | 12/1987 | Di Mino et al. | 338/195 |
| 4,737,757 A | * | 4/1988 | Senda et al. | 338/308 |
| 4,837,550 A | * | 6/1989 | Plough, Jr. | 338/308 |
| 5,187,559 A | * | 2/1993 | Isobe et al. | 257/538 |
| 5,369,245 A | * | 11/1994 | Pickering | 219/209 |
| 5,466,484 A | * | 11/1995 | Spraggins et al. | 438/385 |
| 5,587,097 A | * | 12/1996 | Sato et al. | 219/543 |
| 7,119,656 B2 | * | 10/2006 | Landsberger et al. | 338/195 |
| 2002/0008302 A1 | | 1/2002 | Singh et al. | 257/538 |
| 2002/0033519 A1 | * | 3/2002 | Babcock et al. | 257/536 |
| 2004/0207507 A1 | | 10/2004 | Landsberger et al. | |

| 2006/0279349 | A1* | 12/2006 | Grudin et al. ............... 327/334 |
|---|---|---|---|
| 2007/0109091 | A1 | 5/2007 | Landsberger et al. |
| 2009/0142858 | A1* | 6/2009 | Landsberger et al. ............ 438/5 |

FOREIGN PATENT DOCUMENTS

| WO | WO2004097859 | 11/2004 |
|---|---|---|
| WO | WO2007085095 | 8/2007 |

OTHER PUBLICATIONS

K. Kato, T. Ono, Y. Amemiya, A Monolithic 14 Bit D/A Converter Fabricated with a New Trimming Technique (DOT), IEEE, J. of Solid-State Circuits, vol. SC-19, No. 5, Oct. 1984.*

International Search Report issued on Jun. 26, 2009 with respect to corresponding International Patent Application No. PCT/CA/2009/000320.

* cited by examiner

*Primary Examiner* — Dana Ross
*Assistant Examiner* — Gyounghyun Bae

(74) *Attorney, Agent, or Firm* — Norton Rose Fulbright Canada LLP

(57) ABSTRACT

There is described a method for stabilizing a post-trimming resistance of a thermally isolated electrical component made from a thermally mutable material, the method comprising: generating at least one heating pulse, the at least one heating pulse having an initial amplitude corresponding to a trimming temperature, a slope corresponding to a given cooling rate and a duration corresponding to a given cooling time; and applying the at least one heating pulse to one of the thermally isolated electrical component and a heating device in heat transfer communication with the thermally isolated electrical component, after a trimming process, in order to cause the electrical component to cool in accordance with the given cooling rate, the given cooling rate being slower than a passive cooling rate determined by the thermal isolation of the electrical component.

25 Claims, 21 Drawing Sheets

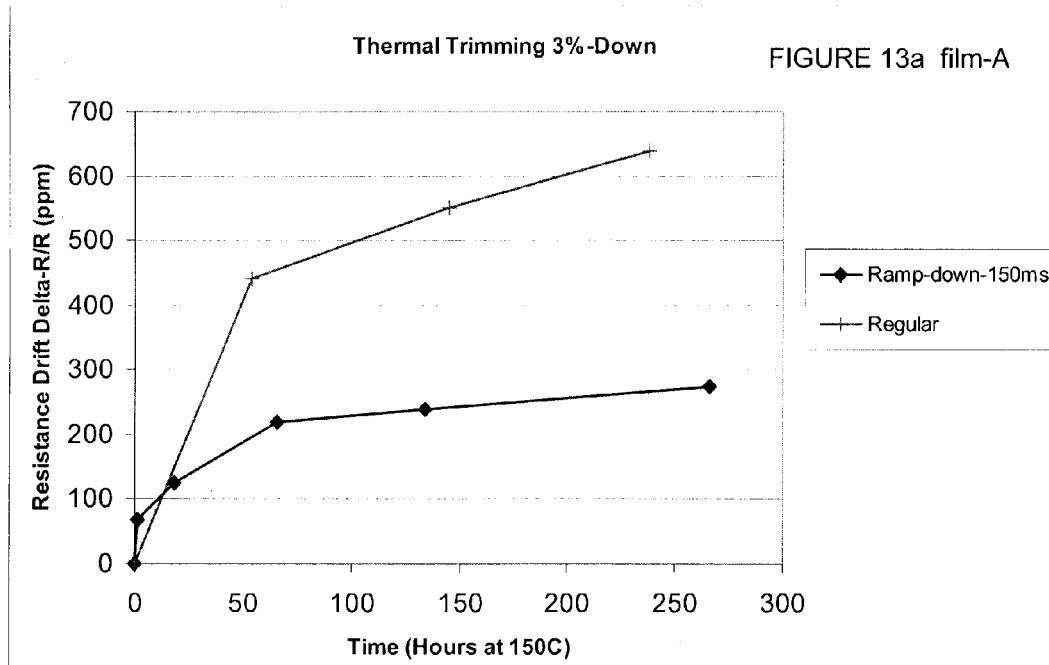
FIGURE 13a film-A
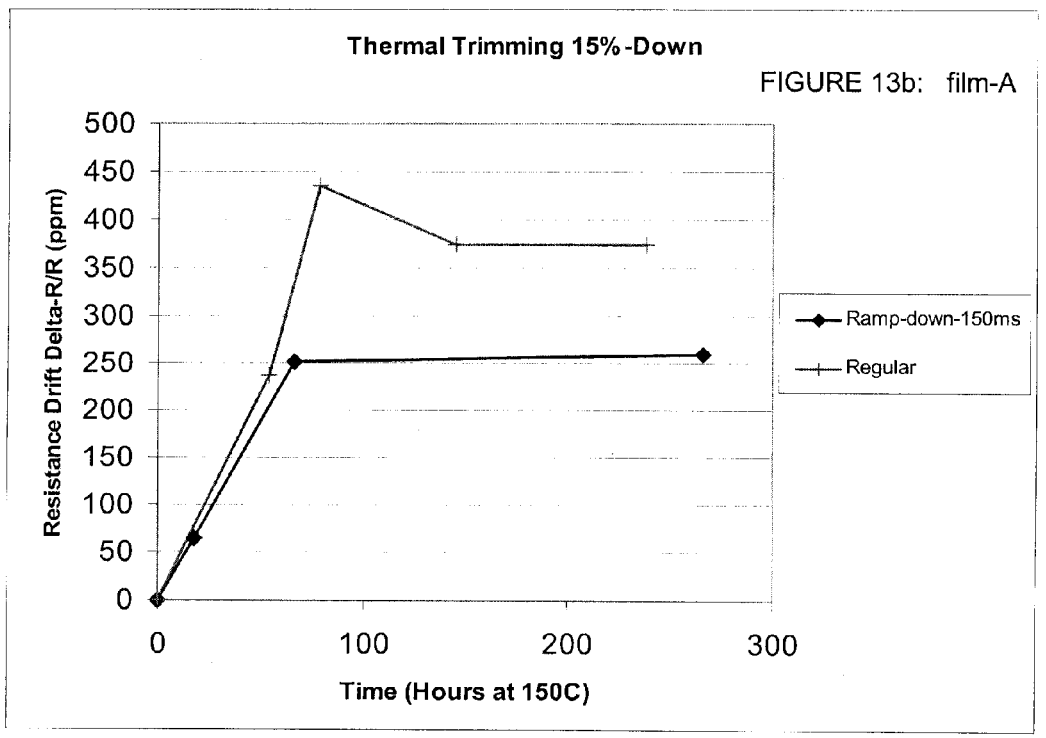
FIGURE 13b: film-A

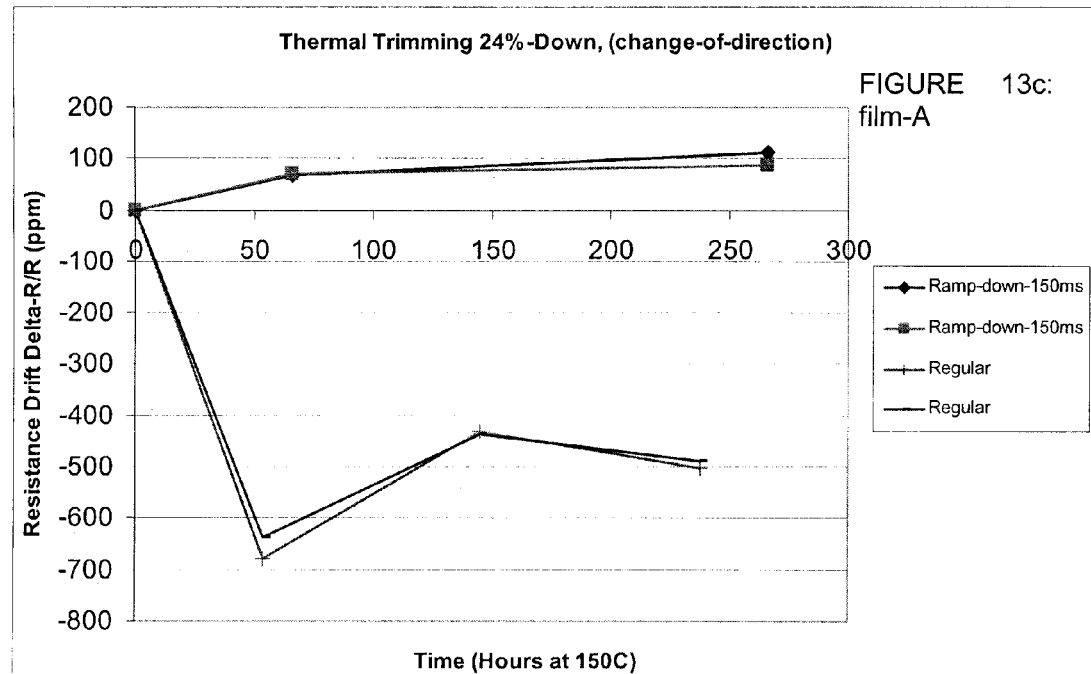
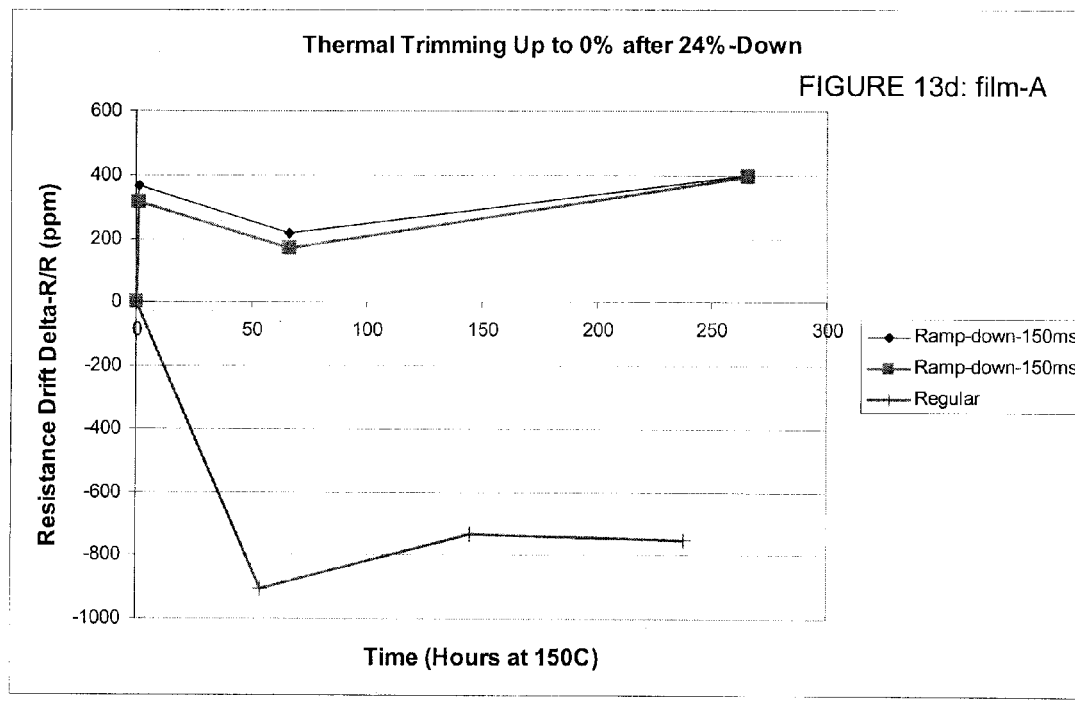

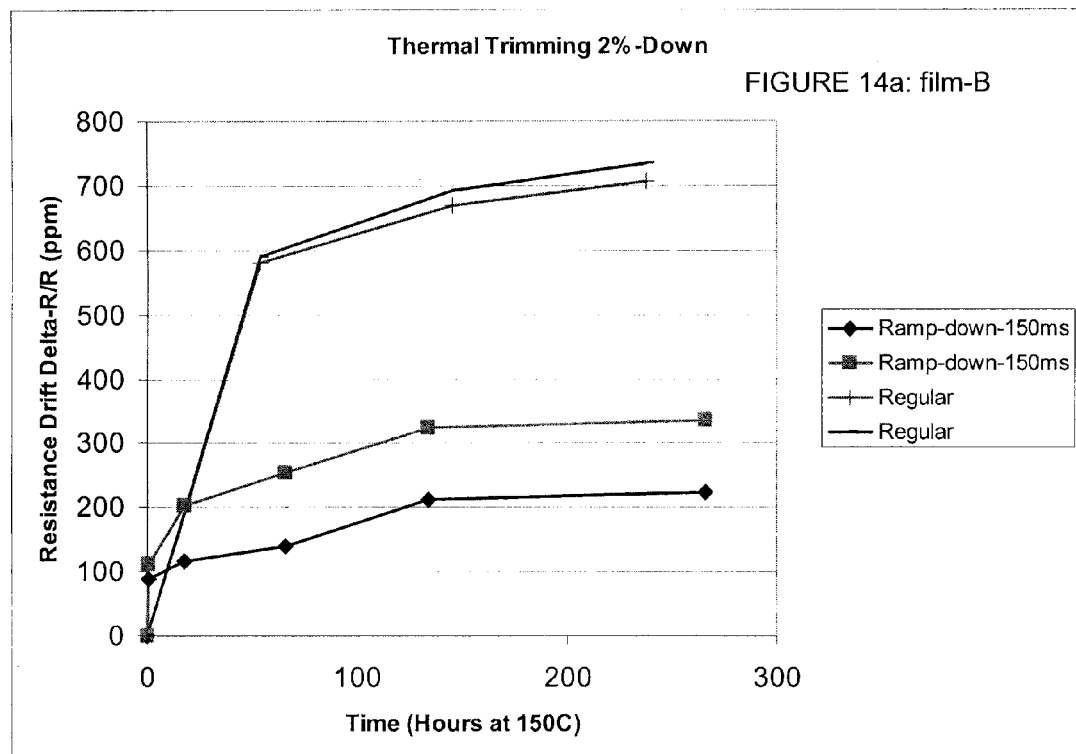
FIGURE 14a: film-B
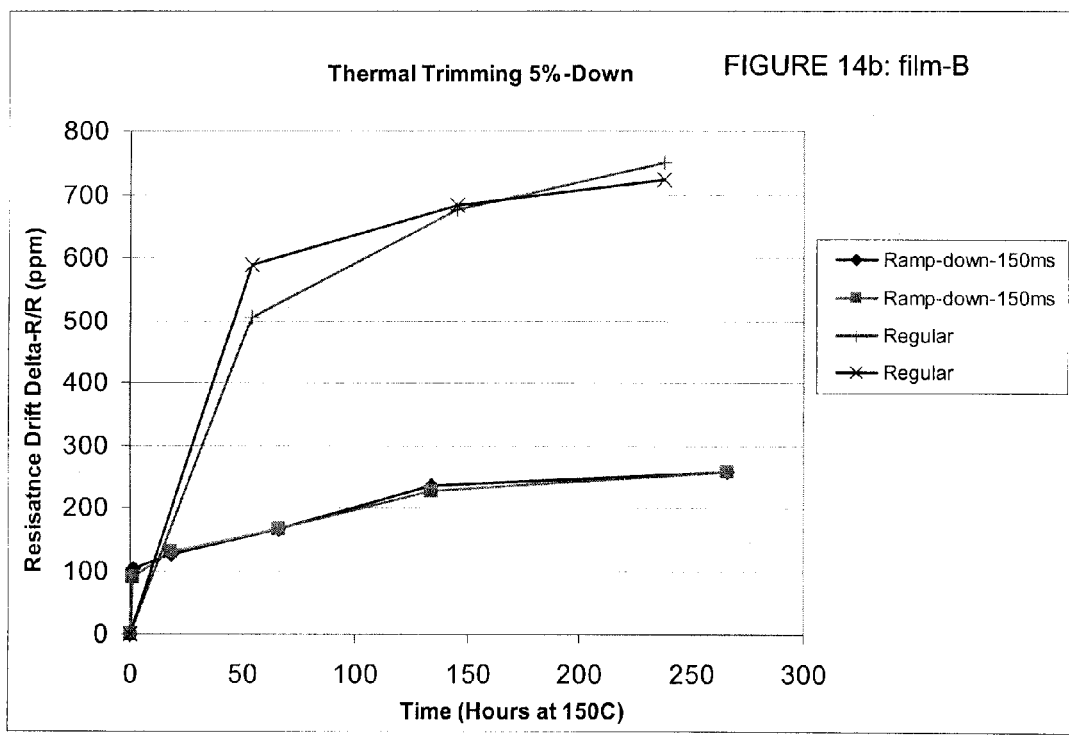
FIGURE 14b: film-B

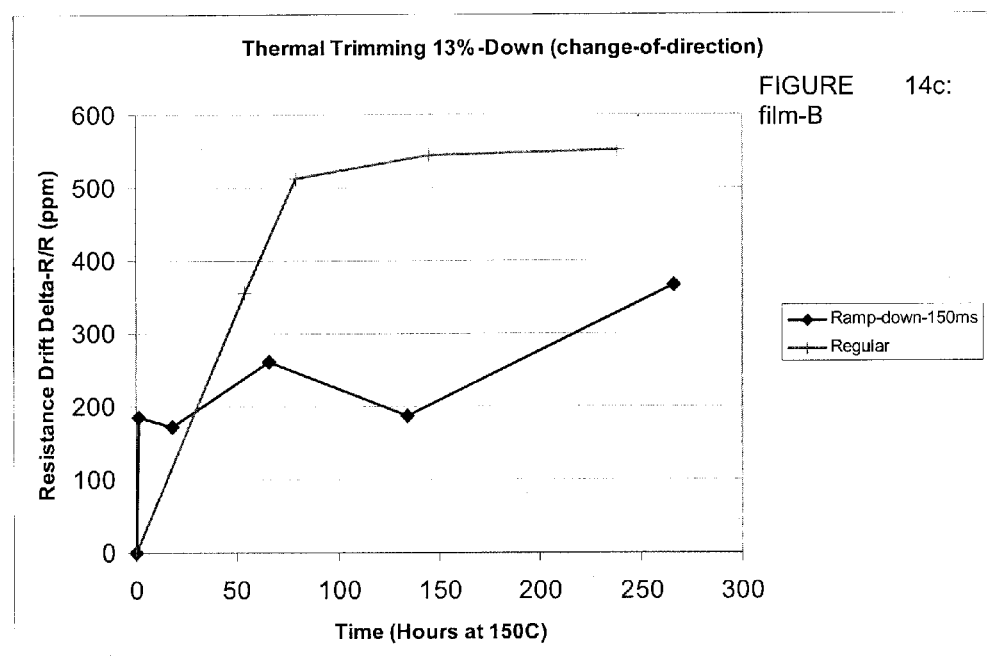

METHOD OF STABILIZING THERMAL RESISTORS

CROSS-REFERENCE TO RELATED APPLICATIONS

The present application claims priority under 35 USC §119 (e) of Provisional Patent Application bearing Ser. No. 61/036,597, filed on Mar. 14, 2008, the contents of which are hereby incorporated by reference.

TECHNICAL FIELD

The invention relates to the field of thermally-trimmable resistors. More specifically, it relates to the post-thermal-trimming stability of resistors (resistance).

BACKGROUND OF THE INVENTION

Certain thermally-mutable materials, such as polycrystalline silicon, also called polysilicon, polycrystalline SiGe or thin-film materials such as tungsten silicide for example, respond to heating or voltage pulses above a certain threshold by changing their electrical resistance. This procedure is called thermal trimming or adjustment of electrical resistors and is used in the manufacture of microelectronics and electronic components, as well as in common design of user circuits. In principle, one trims the resistor until an observable local or global circuit parameter reaches a desired value.

When thermally-trimmable materials are placed in thermally-isolated microstructures, they can be cooled down from a high temperature very quickly, once the heating source is removed. However, there is experimental evidence that rapid cooling from thermal trimming temperatures, known as quenching, may cause resistance instability during storage or operation as resistors. Therefore, there is a need to improve post-trimming resistance stability of thermally-mutable resistors.

SUMMARY OF THE INVENTION

There is described herein a method for adaptively generating a temperature ramp-down, in order to improve post-thermal-adjustment resistance stability, using specifically designed ramp-down signals. There is also described intentionally regulating the cooling rate to a cooling schedule which provides improved post-trim stability.

In accordance with a broad aspect, there is provided a method for stabilizing a post-thermal-trimming resistance of a thermally isolated electrical component made from a thermally mutable material, the method comprising: generating at least one heating signal, the at least one heating signal having an initial amplitude corresponding to an annealing temperature, a slope corresponding to a given cooling rate and a duration corresponding to a given cooling time; and applying the at least one heating signal to one of the thermally isolated electrical component and a heating device in heat transfer communication with the thermally isolated electrical component, after a trimming process, in order to cause the electrical component to cool in accordance with the given cooling rate, the given cooling rate being slower than a passive cooling rate determined by a natural thermal time constant associated with the thermal isolation and thermal inertia of the electrical component.

In accordance with another broad aspect, there is provided a method for stabilizing a post-thermal-trimming resistance of a thermally-isolated electrical component made from thermally mutable material, the method comprising heating the electrical component during a cooling phase after a thermal trimming process in order to cause the temperature of the electrical component to decrease in accordance with a cooling rate which is slower than a passive cooling rate determined by a natural thermal time constant associated with the thermal isolation and thermal inertia of the electrical component.

In accordance with yet another broad aspect, there is provided a thermally-trimmed, thermally-isolated, thin-film resistor having a stability defined by resistance drift less than about 300 parts per million after more than about 250 hours at about 150° C.

A trimming process refers to any method that allows the heating of a thermally trimmable electrical component to a trimming temperature during a given period of time in order to change the electrical resistance of the electrical component. A trimming process may consist in directly heating the thermally trimmable electrical component by applying a trimming signal to the electrical component. In another example, the thermally trimmable electrical component is indirectly heated. In this case, the thermally trimmable electrical component is in heat transfer communication with a heating device, such as an auxiliary resistor for example, which is used to heat the thermally trimmable electrical component in order to change its electrical resistance. A single pulse, multiple pulses, or one or more heating signals may be applied during a trimming process.

The expression "cooling schedule" refers to an intentional control of the cooling rate of a thermally trimmable electrical component at the end of, or after, a thermal trimming process. The cooling rate according to a cooling schedule is slower than that of passive cooling. Passive cooling refers to the cooling of the thermally trimmable electrical component when no cooling schedule is applied. The passive cooling rate is determined by the natural thermal time-constant determined by the material properties and geometry of the resistor and its surroundings. Note that the term "cooling rate" refers to a cooling rate that can vary with time and/or to a cooling that is constant with time.

The expression "heating signal" refers to any signal that is used for directly or indirectly heating a thermally trimmable electrical component, either for the purposes of cooling after a trimming process, or to reach thermal-trimming temperatures in order to change the electrical resistance of the electrical component to a target value. A heating signal can be an electrical signal directly or indirectly applied to the thermally trimmable electrical component. Another example of a heating signal consists in a laser signal used to heat the electrical component. A heating signal can be directly applied to the thermally trimmable electrical component, thereby increasing the temperature of the electrical component. Alternatively, the heating signal can be applied to an auxiliary heating device in heat transfer communication with the thermally trimmable electrical component. In one embodiment, a heating signal comprises a single heating pulse. In another embodiment, a heating signal comprises a plurality of heating pulses.

The expression "ramp-down signal" refers to any heating signal or waveform that is used to implement a cooling schedule. The application of a ramp-down signal to a thermally trimmable electrical component directly or indirectly heats the electrical component in accordance with the cooling schedule, thereby controlling the cooling rate of the thermally trimmable electrical component. For example, a ramp-down signal can be an electrical signal or a laser signal. A ramp-down signal can be directly applied to the thermally trimmable electrical component. Alternatively, the ramp-down signal can be applied to a heating device in heat transfer communication with the thermally trimmable electrical component. In one embodiment, a ramp-down signal comprises a single ramp-down pulse. In another embodiment, a ramp-down signal comprises a plurality of ramp-down pulses spaced apart in time. A cooling schedule indicates when a ramp-down signal should be applied and which characteristics the ramp-down signal should have.

The expression "temperature ramp-down" or "ramp-down" refers to the temperature profile as a function of time of the thermally trimmable resistor when a ramp-down signal is applied to the electrical component.

The expression "thermally isolating a component" refers to isolating the component from other elements such that the heat flux (proportional to temperature differential) generated between the component and the other elements, is substantially low. For example, a microstructure suspended over a cavity in a substrate is an example of a thermally isolated component.

In this specification, the term "Threshold Temperature" ($T_{th}$) is intended to mean the lowest temperature at which an observable change of resistance occurs. The term "Maximum Temperature" ($T_{max}$) is the highest temperature that is reached during the trimming process. In addition, while some of the examples relate specifically to resistors that are thermally-isolated by being embedded in a microstructure suspended above a cavity, any type of thermal isolation leading to rapid cooling of the resistor post-trimming that may cause post-trim instability are considered to be covered by the present method.

BRIEF DESCRIPTION OF THE DRAWINGS

Further features and advantages of the present invention will become apparent from the following detailed description, taken in combination with the appended drawings, in which:

FIG. 2a is a flow chart of a method for stabilizing a post-trimming resistance of a thermally isolated electrical component, in accordance with an embodiment;

FIGS. 13a-13d show experimental measurement results of accelerated drift tests for resistors made from the thin film resistive material, film-A;

FIGS. 14a-14c show experimental measurement results of accelerated drift tests for resistors made from the thin film resistive material, film-B;

It will be noted that throughout the appended drawings, like features are identified by like reference numerals.

DETAILED DESCRIPTION

Figure 1:
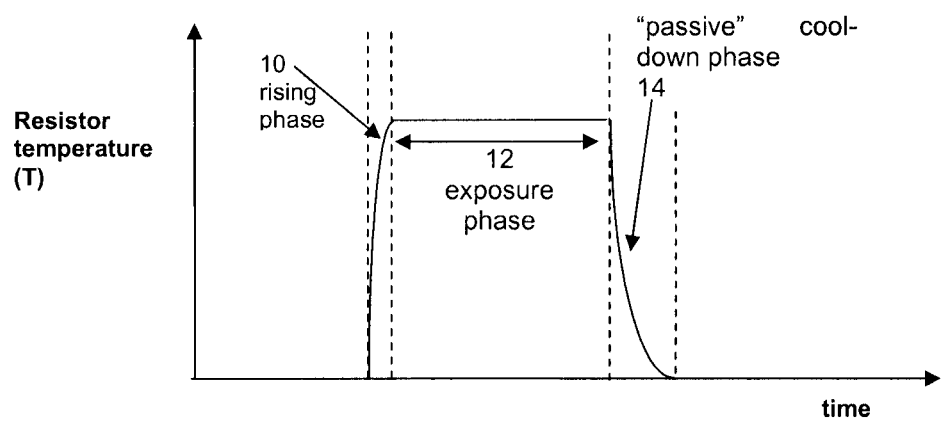
FIG. 1 is a graph of resistor temperature vs. time for one thermal-trimming temperature-pulse, having a rising phase, an exposure phase, and a cool-down phase in accordance with the prior art.

There is described herein a method for adaptively generating a temperature ramp-down, in order to improve post-thermal-adjustment resistance stability, using specifically designed ramp-down signals. There is described intentionally regulating the cooling rate, to a cooling schedule which provides improved post-trimming stability by reducing the cooling rate compared to a passive cooling rate.

A typical thermally isolated microstructure such as described in U.S. Pat. No. 7,249,409 can have a thermal mass on the order of $10^{-8}$ J/K to $10^{-7}$ J/K, and can have a thermal time-constant of roughly 1-10 ms. This rapid cooling ability allows the use of adaptive sequences of short high-temperature pulses, to reach high precision thermal adjustments in a few seconds or less (e.g 0.3 to 10 seconds).

Another example of a rapid cooling system consists in a microstructure suspended over a cavity in a silicon substrate, housing a thermally-trimmable resistor. In such a case where the microstructure is suspended over a void, the relevant mass being heated may be the entire microstructure itself, including the thermally-trimmable resistor. If the volume of the microstructure is, for example, approximately 100 um (width)×50 um (length)×5 um (thickness), then the volume is 2.5E-8 cm$^3$. The mass of such a microstructure would then be (Mass)=(Volume)*(density)=approx 2.5E-8 cm$^3$*2.5 g/cm$^3$=6.25E-8 grams. Then the heat capacity of the microstructure would be C=(Mass)*(specific heat)=approx 6.25E-8 J/K. If the thermal isolation of the microstructure were G=50 K/mW, then the characteristic cooling time-constant would be t=C*G=3.125E-3 second=approx 3 ms. For example, while cooling from about 1000° C. in a room-temperature ambient, the temperature would reach about 370° C. after about 3 ms, experiencing a cooling rate of about 200° C. per ms (2×10$^{5°}$ C./second). Other configurations and thermal isolation numbers are available (including those in PCT Patent Application No WO 2006/050607, the contents of which are hereby incorporated by reference).

However, such a rapid cooling may cause resistance instability after the trimming process. This resistance instability may be due to residual defects within the material caused by the quenching, such as nano-scale material imperfections, or point defects being "frozen in".

Considering polycrystalline silicon, a high cooling rate can cause the formation of high concentrations of non-equilibrium solid solutions and point defects, trapped in the quenched poly-Si materials. Very high concentrations of point defects are generated by heating to high temperatures (e.g. greater than about 800° C.), and the concentrations of point defects remaining at room temperatures increase dramatically with increasing cooling rates (i.e. the most rapid cooling from the highest temperature causes the greatest concentration of various point defects to remain after cooling). These point defects are described as elementary lattice defects that affect electrical activation of the dopants and other physical and electrical phenomena.

Impurity diffusion in silicon is sensitive to the presence of point defects such as silicon interstitials. Therefore, oxygen atoms, (which are not stable at the interface between polycrystalline silicon and surrounding silicon dioxide ($SiO_2$)), can react with the existing point defects. Furthermore, vacancies and self-interstitials can exist in various charge states. For example, boron-vacancy and boron-interstitial complexes are able to trap electrons at the gap levels and are unstable at room temperature. Each of these physical phenomena can contribute to post-trim resistance drift during operation or storage—and their effect is increased when concentrations of point defects are greater—an effect which is increased by very rapid cooling. Post-trim instability of materials other than polysilicon may be caused by other similar nano-scale material imperfections or phenomena, whose concentration and/or severity may also depend on the cooling rate after a high-temperature pulse.

Resistance instability (drift of room-temperature resistance during long-term operation or storage, or accelerated drift-testing), after thermal adjustment is an important consideration, since instability degrades high-precision adjustment.

FIG. 1 shows a diagrammatic graph of the resistor temperature vs. time, for one temperature pulse for thermal trimming of the resistor in accordance with the prior art. It has, broadly, a rising phase 10, an exposure phase 12, and a cool-down phase 14. While the exposure phase 12 is depicted in FIG. 1a as a constant resistor temperature, it should be understood that the resistor temperature may vary with time during the exposure phase 12. After the end of this exposure phase 12, the heating stimulus is typically removed, allowing the resistor to cool. In such a case, the rate of cooling is usually governed by the (typically passive) material properties and geometrical arrangements of the surroundings of the resistor in question. In FIG. 1a, this is labeled as the "passive" cool-down phase. By designing the thermal mass and thermal isolation of the surrounding materials and microstructures such that the resistors can be heated and cooled very quickly, this allows adaptive sequences of thermal-trimming pulses to be executed in a relatively short time. However, this brings also the rapid cooling rates (limited only by the passive material and geometrical properties, thermal mass and thermal isolation) which can cause elevated concentrations of material imperfections (defects), and long-term resistance instability. By deliberately controlling (slowing) the cool-down phase (see FIGS. 4b, 4c) of only the last pulse (see FIGS. 5a-5c, and 6a-6c) or last few pulses, in an adaptive adjustment sequence, one can reduce the defect concentrations and instability, without dramatically increasing the total time required for the adaptive adjustment sequence.

Figure 2A:
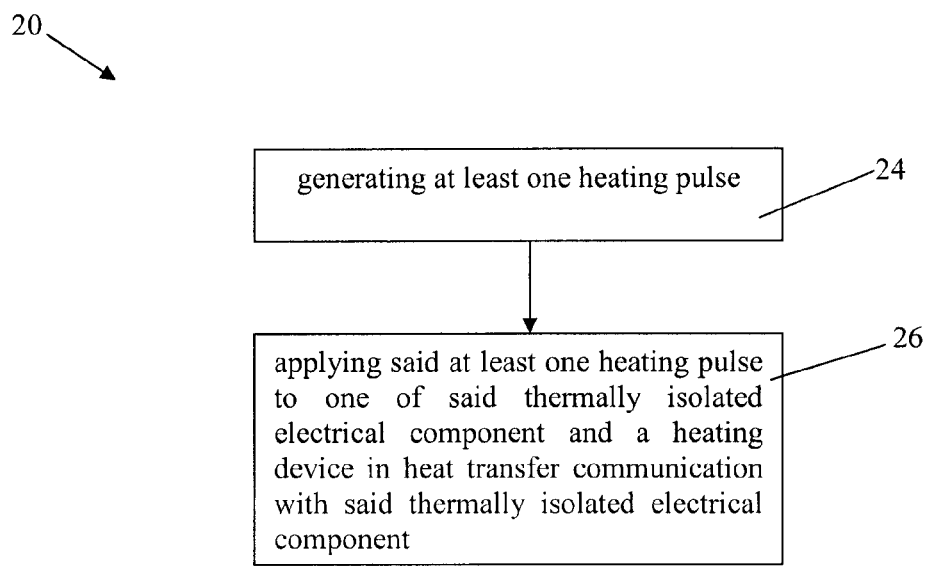
FIG. 2a is a flow chart of a method for trimming a parameter of an electrical component made from a thermally mutable material and cooling the electrical component, in accordance with an embodiment.

FIG. 2a illustrates one embodiment of a method 20 for stabilizing a post-trimming resistance of a thermally isolated electrical component made from a thermally mutable material. The first step 24 is the generation of at least one heating signal, such as a ramp-down pulse. The heating ramp-down pulse is characterized by an initial amplitude corresponding to a trimming temperature, a slope corresponding to a given cooling rate and a duration corresponding to a given cooling time. The last step 26 of the method 20 consists in applying the at least one heating ramp-down pulse to the thermally isolated electrical component or a heating device in heat transfer communication with the thermally isolated electrical component. The application of the at least one heating ramp-down signal reduces the cooling rate of the electrical component compared to a passive cooling rate determined by the natural thermal time constant of determined by the thermal isolation and thermal inertia of the electrical component.

It should be understood that the slope of a heating ramp-down signal may be constant in time (i.e. non-time-varying). Alternatively, the slope can vary in time so that the heating ramp-down pulse can have any shape as long as the end amplitude corresponds to a lower temperature than the temperature corresponding to the start amplitude, when the pulse is applied to the electrical component.

Figure 2B:
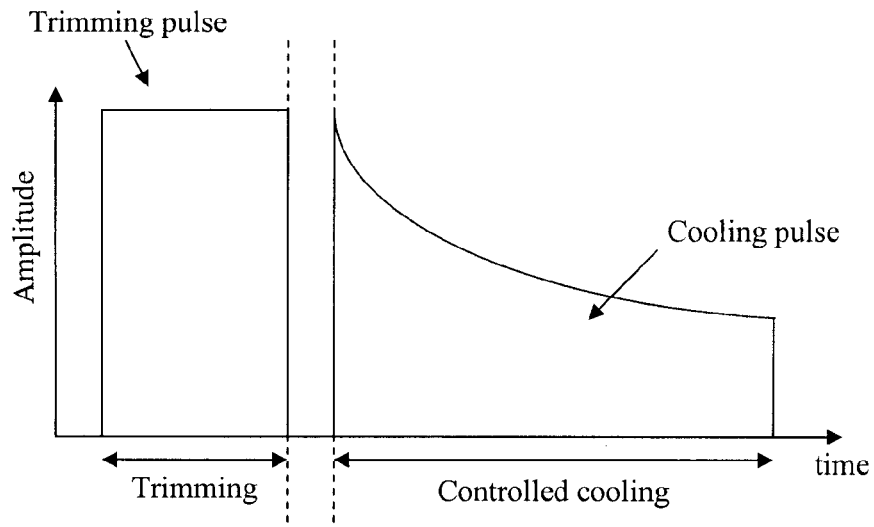
FIG. 2b illustrates a ramp-down pulse separated in time from a trimming pulse, in accordance with an embodiment.

FIG. 2b illustrates an embodiment of a ramp-down signal preceded by a trimming signal. In this embodiment, both the trimming signal and the ramp-down signal comprise a single pulse, namely a square pulse and a decreasing pulse, respectively. These are examples of types of pulses that can be used. The start amplitude of the ramp-down pulse is substantially equal to the end amplitude of the trimming pulse. It should be understood that the period of time between the trimming pulse and the ramp-down pulse may have any duration. For example, this period of time may be equal to a few hundreds of milliseconds, a few seconds, a few hours, etc.

Figure 2C:
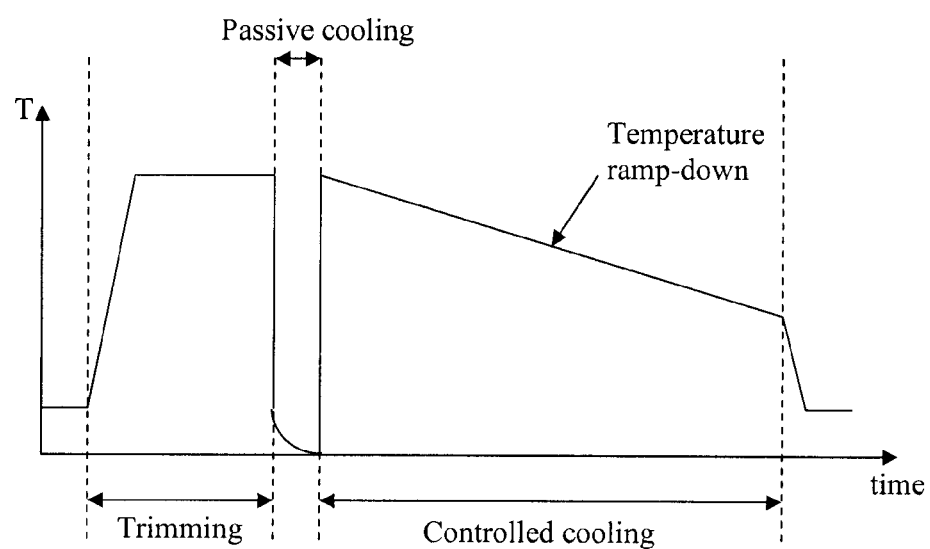
FIG. 2c is a graph of an electrical component temperature vs. time when the trimming pulse and the ramp-down pulse illustrated in FIG. 2b are applied to an electrical component, in accordance with an embodiment.

FIG. 2c illustrates the temperature of the electrical component during the trimming and cooling processes when the trimming pulse and the ramp-down pulse illustrated in FIG. 2b are applied to the electrical component. Before the trimming process, the electrical component has an initial temperature. During the trimming process, the temperature of the electrical component increases from the initial temperature to a thermally trimmable temperature and the resistance of the electrical component is adjusted to the target value. Between the trimming and the cooling periods of time, the electrical component experiences a passive cooling during which the cooling rate of the electrical component is dictated by the natural thermal time-constant determined by the material properties and geometry of the resistor and its surroundings. When the ramp-down pulse is applied to the electrical component, the decrease of the temperature of the electrical component is slower than that during the passive cooling because of the application of the ramp-down signal. The temperature versus time of the electrical component during the controlled cooling period is referred to as a temperature ramp-down. As the start amplitude of the ramp-down pulse is substantially equal to the end amplitude of the trimming pulse, the electrical component has substantially the same temperature at the end of the trimming period of time than at the beginning of the cooling period of time.

In one embodiment, the start amplitude of the ramp-down pulse is chosen so that the temperature ramp-down begins at a temperature lower than that at the end of the trimming. In this case, the corresponding cooling schedule may "heal" (anneal) less of the material imperfections (defects) than a cooling schedule for which the temperature ramp-down begins at the same temperature than that at the end of the trimming.

In another embodiment, the start amplitude of the ramp-down pulse is chosen so that the temperature ramp-down begins at a temperature higher than that imposed by the last trimming pulse.

Figure 3A:
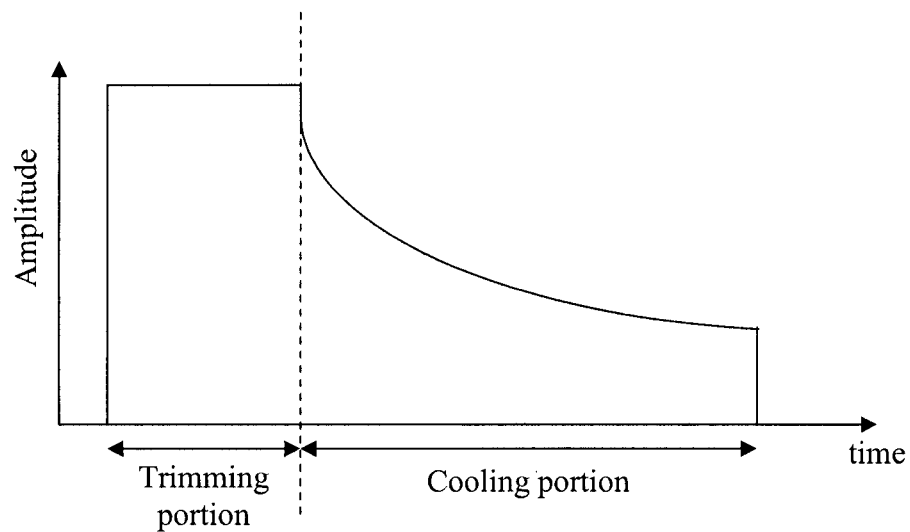
FIG. 3a illustrates a trimming-with-ramp-down pulse, in accordance with an embodiment.

FIG. 3a illustrates an embodiment of ramp-down pulse which is applied at the end of the trimming pulse. No period of time separates the end of the trimming pulse and the beginning of the ramp-down pulse. Such a combination of a trimming pulse and a ramp-down pulse can be seen as a single trimming-with-ramp-down pulse having a trimming component for trimming the resistance of the electrical component and a cooling component for controlling the cooling rate of the electrical component.

Figure 3B:
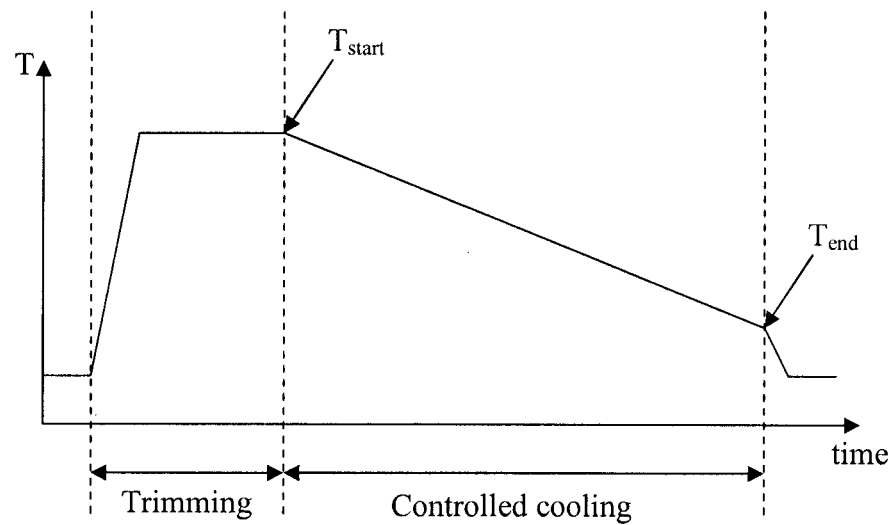
FIG. 3b is a graph of an electrical component temperature vs. time when the trimming-with-ramp-down pulse of FIG. 3a is applied to the electrical component, in accordance with an embodiment.

FIG. 3b illustrates the temperature of the electrical component during the trimming and cooling processes when the single trimming-with-ramp-down pulse of FIG. 3a is applied to the electrical component. Before the trimming process, the electrical component has an initial temperature. When the trimming component of the trim-with-ramp-down pulse is applied to the electrical component, the temperature of the electrical component increases from the initial temperature to thermally trimmable temperatures in accordance with the trimming schedule of FIG. 3b and the resistance of the electrical component is adjusted to the target value. When the cooling component of the trim-with-ramp-down pulse is applied to the electrical component, the temperature of the electrical component decreases in a controlled manner. When a trim-with-ramp-down pulse is used for trimming and cooling an electrical component, no passive cooling period exists between the trimming and cooling periods of time.

It should be understood that the application of a ramp-down signal to the electrical component may trim the resistance of the electrical component since the starting amplitude of the ramp-down signal may be chosen to bring the electrical component to a trimming temperature. However, in one embodiment, the application of the ramp-down pulse to the electrical component has a negligible impact on the value of the resistance and the trimming effect of the ramp-down pulse is negligible. Still the annealing of the material during the ramp-down may be beneficial to the stability of the resistance, even if the ramp-down pulse begins at a temperature below the trimming threshold temperature. Alternatively, the trimming effect of the ramp-down pulse is not negligible and can be used for adjusting the resistance to a target value. For example, trimming pulses can be used to trim the resistance to an intermediary value and ramp-down signals can be used for both annealing the material imperfections and adjusting the resistance from the intermediary value to a final target value.

Figure 4A:
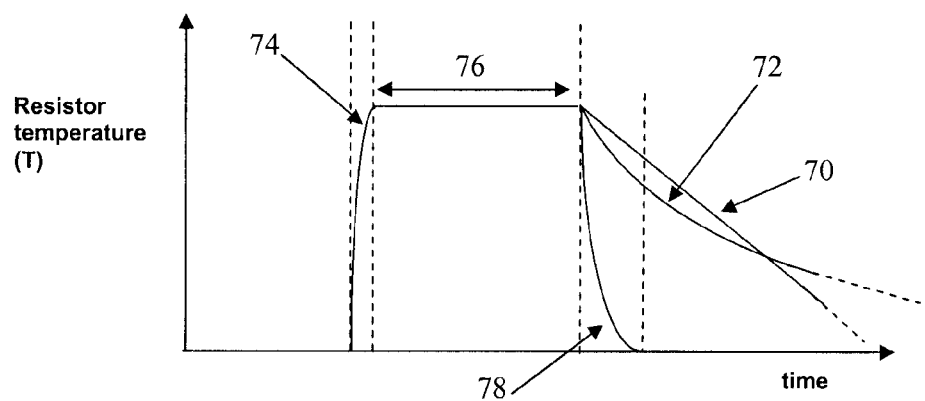
FIG. 4a is a graph of resistor temperature vs. time for one thermal-trimming temperature-pulse, having a rising phase, an exposure phase, and two different cool-down phases in accordance with embodiments.

FIG. 4a illustrates two embodiments of a temperature ramp-down 70 and 72 which result from the application of a trimming-with-ramp-down pulse to the electrical component in accordance with two different cooling schedules. It is a diagrammatic graph of the resistor temperature vs. time for one thermal-trimming temperature-pulse, showing two generic examples of intentional non-passive ramp-down schedules, (1) cooling rate is constant with time, and (2) cooling rate decreasing with time, both examples slower than the "passive" cool-down rate. Time-durations of the phases are not necessarily to scale. The rising edge 74 and the exposure phase 76 result from the trimming portion of the trimming-with-ramp-down pulse. The electrical resistance of the electrical component is trimmed during the exposure phase 76. The falling edge 78 illustrates the passive cooling that would occur if only a trimming pulse would be applied to the electrical component. The falling edges 70 and 72 are less sloping than the passive falling edge 78, and therefore, the application of a trimming-with-ramp-down ramp-down pulse slows down the cooling of the electrical component after the trimming process. It should be understood that it is also possible to have an intentional cooling rate which increases with time (not shown).

Figure 4B:
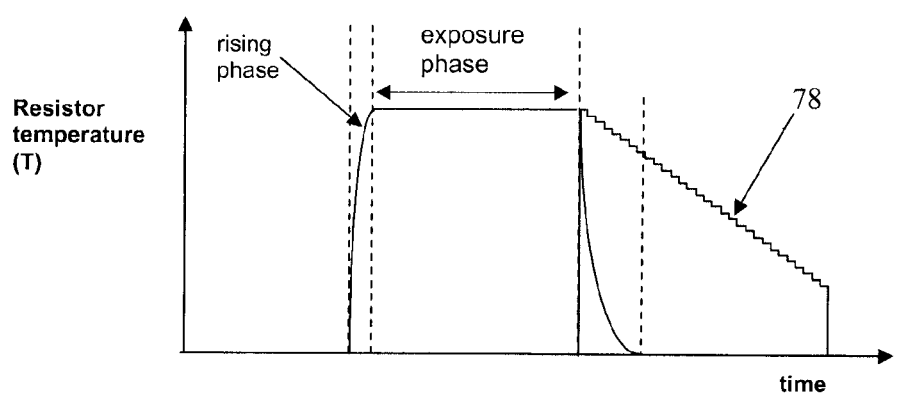
FIG. 4b is a graph of resistor temperature vs. time for one thermal-trimming temperature-pulse, showing another example of an intentional non-passive cooling schedule in accordance with embodiments.

FIG. 4b illustrates one embodiment of a temperature ramp-down 78 composed of discrete steps which results from the application of a trimming-with-ramp-down pulse having a stepped ramp-down component. The parameters of the steps (height, width) may be constant throughout the temperature ramp-down, as illustrated in FIG. 4b, or may vary with time (not shown). A stepped temperature ramp-down results from the application of a stepped ramp-down signal to the resistor in accordance with a stepped cooling schedule or from the application of a trimming-with-ramp-down pulse of which the cooling component is composed of discrete steps. FIG. 4b is a diagrammatic graph of the resistor temperature vs. time for one thermal-trimming temperature-pulse, showing another example of an intentional non-passive ramp-down schedule, slower than the "passive" cool-down rate. This example shows a stepped ramp-down schedule. Time-durations of the phases are not necessarily to scale.

Figure 4C:
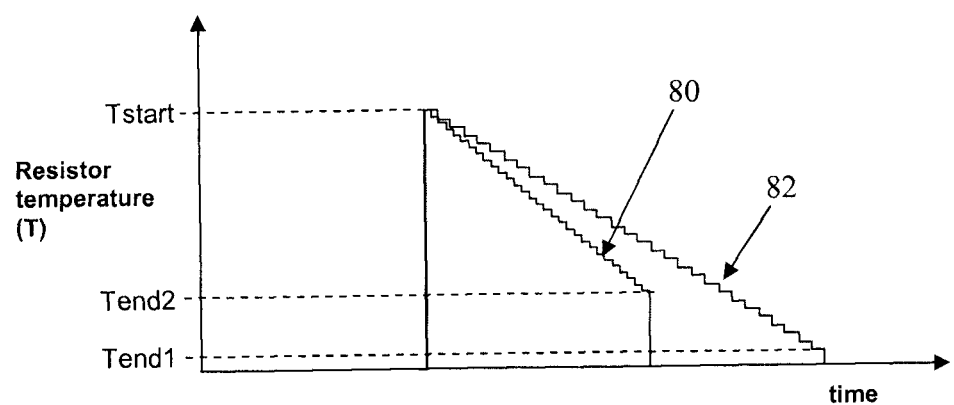
FIG. 4c is a graph of resistor temperature vs. time for stepped, non-passive cooling schedules. The two examples shown have the same $T_{start}$ (peak of the cooling schedule), different ramp-down durations, different slopes (cooling rates), and different end-points ($T_{end}$ values) in accordance with embodiments.

FIG. 4c illustrates two embodiments of discrete stepped temperature ramp-downs 80 and 82 in accordance with stepped ramp-down pulses. The two temperature ramp-downs 80 and 82 have the same $T_{start}$ which corresponds to the peak of the temperature curve. However they have different ramp-down durations, different slopes (cooling rates), and different end-points (called $T_{end1}$ and $T_{end2}$) due to different cooling schedules. FIG. 4c is a diagrammatic graph of examples of resistor temperature vs. time for stepped, non-passive ramp-down schedules.

The optimal details and parameters of the cooling schedule may vary widely for different resistor materials, film thicknesses, geometries, and can be found experimentally. For example, different materials may have different $T_{th}$ at which an observable change of resistance occurs. Or different applications may demand a finer or coarser level of "observable change of resistance", and thus a correspondingly lower or higher defined level $T_{th}$.

In one embodiment, the end of the cooling schedule, namely $T_{end}$ is chosen so that the temperature of the resistor is low enough to ensure that no quenching (i.e. thermal shock) will occur after the end of the cooling schedule.

Figure 4D:
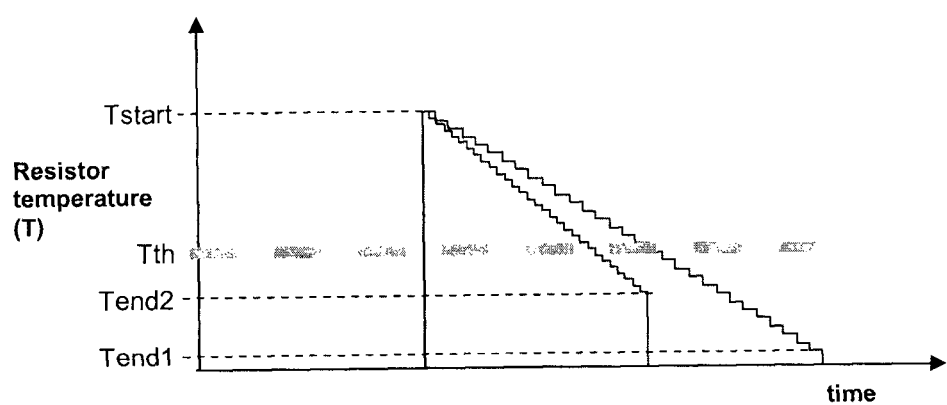
FIG. 4d is a graph of resistor temperature vs. time for stepped, non-passive cooling schedules, where the cooling schedules end below $T_{th}$.

In addition to variation in the defined level of $T_{th}$, for a particular material or film thickness or application, even if $T_{end}$ is below $T_{th}$, (as depicted in FIG. 4d), $T_{end}$ may still be significantly elevated above the ambient temperature during the thermal trimming operation. Therefore even if $T_{end}$ is below $T_{th}$, the drop from $T_{end}$ to the ambient temperature may still constitute a severe-enough quench (thermal shock) to cause significant material imperfections and resistance instability, for example in a thin resistive film whose surface and interface properties have a dominant effect on electrical resistance. FIG. 4d is a diagrammatic graph of examples of resistor temperature vs. time for stepped, non-passive ramp-down schedules. The two examples shown have the same $T_{start}$ (peak of the ramp-down schedule), different ramp-down durations, different slopes (cooling rates), and different end-points ($T_{end}$ values), both below $T_{th}$.

Accordingly, FIGS. 4c and 4d illustrate two different temperature levels, $T_{end1}$ and $T_{end2}$, corresponding to two different final temperatures for the cooling schedule, regardless of the defined $T_{th}$. In FIG. 4d, for example, the cooling schedule ends at two different temperature levels which are both below $T_{th}$. In one embodiment, the parameters of the cooling schedule are chosen as a function of a trade-off between the ramp-down time consumed and the reduction of the quenching effect, in accordance with the needs of one's application and the observed details of the behaviour of the resistor material or film. Different materials or film thicknesses (and different requirements for stability) may demand different $T_{end}$ in the temperature ramp-down.

Figure 5A:
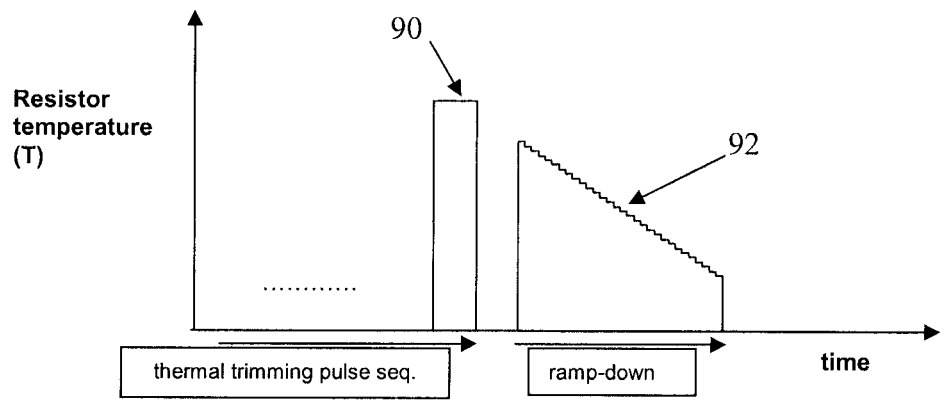
FIGS. 5a-5c are graphs showing examples of cooling schedules at the end of a sequence of thermal-trimming temperature-pulses, in accordance with embodiments.
Figure 5B:
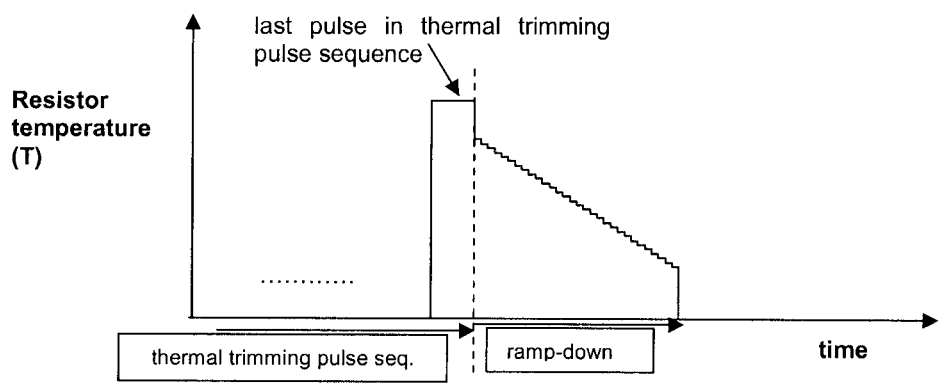
Figure 5C:
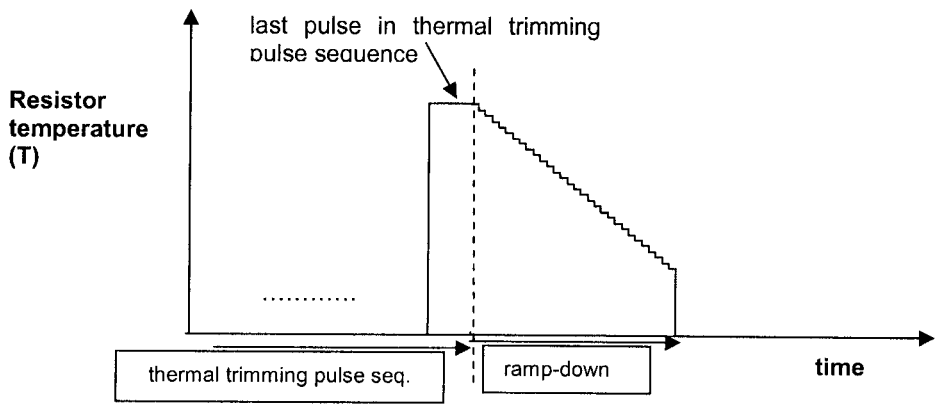

FIGS. 5a-c illustrate further how temperature ramp-downs such as stepped temperature ramp-downs, for example, can be connected to the trimming in a thermal-trimming temperature-pulse sequence. Examples of resistance ramp-down schedules at the end of a sequence of thermal-trimming temperature-pulses are shown as follows. FIG. 5(a): The ramp-down begins some time after the end of the last thermal trimming pulse, and at a lower temperature than the exposure phase of that pulse. FIG. 5(b): The ramp-down begins immediately after the end of the exposure phase of the last thermal trimming pulse, and at a lower temperature than that exposure phase. FIG. 5(c): The ramp-down begins at the end of the exposure phase of the last thermal trimming pulse, and at the same temperature as the end of that exposure phase.

FIG. 5a illustrates the temperature of the electrical component when a trimming signal comprising a plurality of trimming pulses and a ramp-down signal comprising a single ramp-down pulse are applied to the electrical component. A pause (including rapid "passive" cool-down) exists between the last trimming pulse 90 and the beginning of the temperature ramp-down 92, while FIGS. 5b and 5c illustrate the temperature ramp-down beginning immediately at the end of the exposure phase of the last pulse. The last pulse of the heating signal is used to obtain the temperature profile illustrated in FIGS. 5b and 5c is a trimming-with-ramp-down pulse. FIG. 5c illustrates one embodiment of a temperature ramp-down beginning at the same temperature (level) as the end of the exposure phase resulting from the trimming portion of the trimming-with-ramp-down pulse while FIG. 5b illustrates one embodiment of a temperature ramp-down beginning at a substantially lower temperature than that at the end of the exposure phase resulting from the trimming portion of the trimming-with-ramp-down pulse.

In one embodiment, the temperature ramp-down starts at the highest temperature reached during the trimming process in order to prevent any rapid quenching from $T_{max}$ down to the beginning of the temperature ramp-down.

In one embodiment, the temperature ramp-down begins at a temperature lower than that at the end of the trimming. In this case, the corresponding cooling schedule may "heal" (anneal) less of the material imperfections (defects) than a cooling schedule for which the temperature ramp-down begins at the same temperature than that at the end of the trimming.

In another embodiment, the temperature ramp-down begins at a temperature higher than that imposed by the last trimming pulse. This can be the case when the last trimming pulse imposes a temperature inferior to $T_{max}$ of the preceding pulse sequence, for example.

Figure 6A:
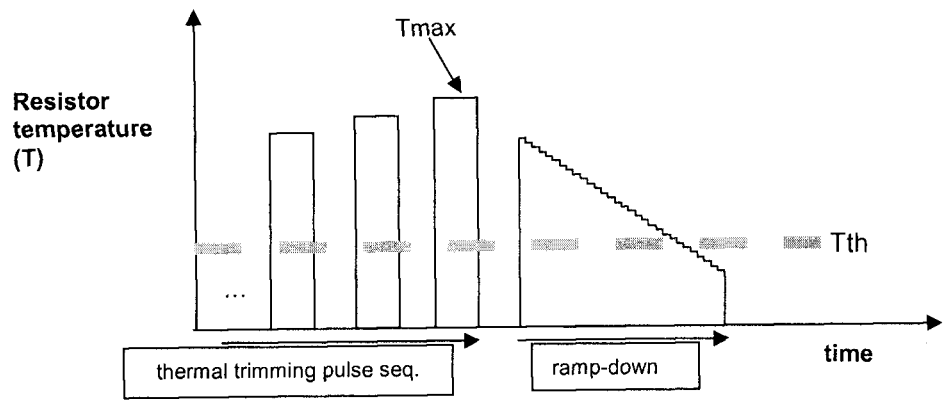
FIGS. 6a-6c are graphs showing examples of stepped, constant-cooling-rate cooling schedules at the end of an increasing thermal-trimming temperature-pulse sequence, in accordance with embodiments.
Figure 6B:
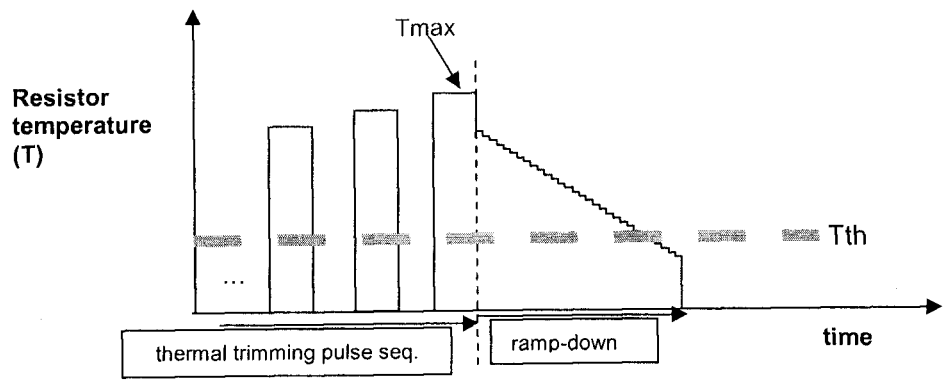
Figure 6C:
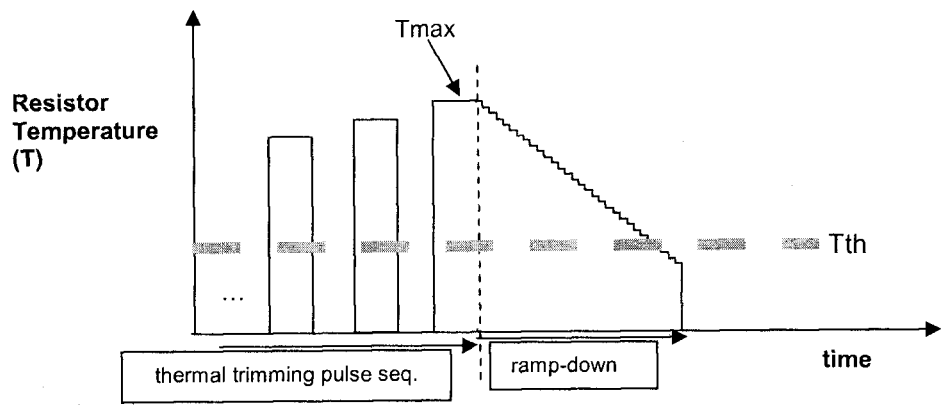

FIGS. 6a-c illustrate the same formations as in FIGS. 5a-c, at the end of an increasing thermal-trimming temperature-pulse sequence, where the last trimming pulse in the trimming sequence provides $T_{max}$. Examples of stepped, constant-cooling-rate resistance ramp-down schedules at the end of an increasing thermal-trimming temperature-pulse sequence are shown as follows. FIG. 6(a): The ramp-down begins some time after the end of the last thermal trimming pulse, and at a lower temperature than $T_{max}$. FIG. 6(b) The ramp-down begins immediately after the end of the exposure phase of the last thermal trimming pulse, and at a lower temperature than $T_{max}$. FIG. 6(c) The ramp-down begins at the end of the exposure phase of the last thermal trimming pulse, at the same temperature ($T_{max}$).

In one embodiment, the present method uses ramp-down pulses which provide a monotonically-decreasing temperature within the targeted functional resistor ("temperature ramp-down"), within the temperature range from $T_{max}$ to below $T_{th}$, as illustrated in FIGS. 6a-c, to intentionally reduce a cooling rate and to provide improved resistance stability after thermal trimming. In FIG. 6a the ramp-down begins some time after the end of the last thermal trimming pulse. In FIG. 6b, the ramp-down begins immediately after the end of the exposure phase of the last thermal trimming pulse and at a lower temperature than $T_{max}$. In FIG. 6c, the ramp-down begins at the end of the exposure phase of the last thermal trimming pulse, at the same temperature ($T_{max}$).

Figure 7A:
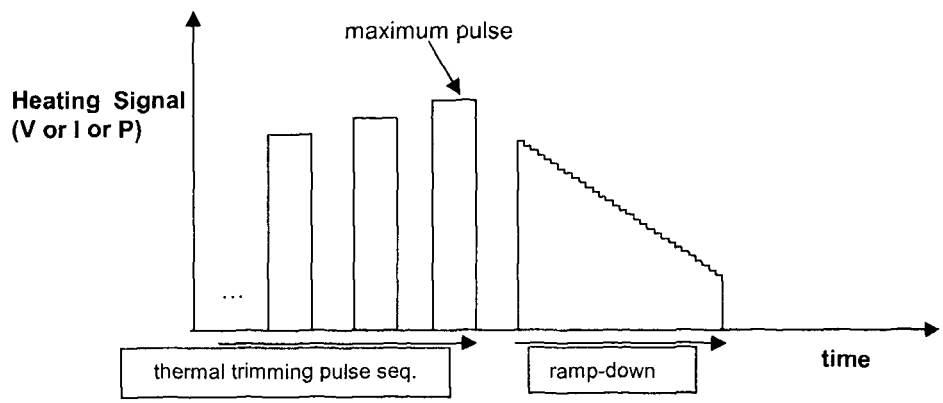
FIGS. 7a-7c are graphs showing examples of stepped, constant-cooling-rate ramp-down signals at the end of an increasing thermal-trimming heating-pulse sequence, in accordance with embodiments.
Figure 7B:
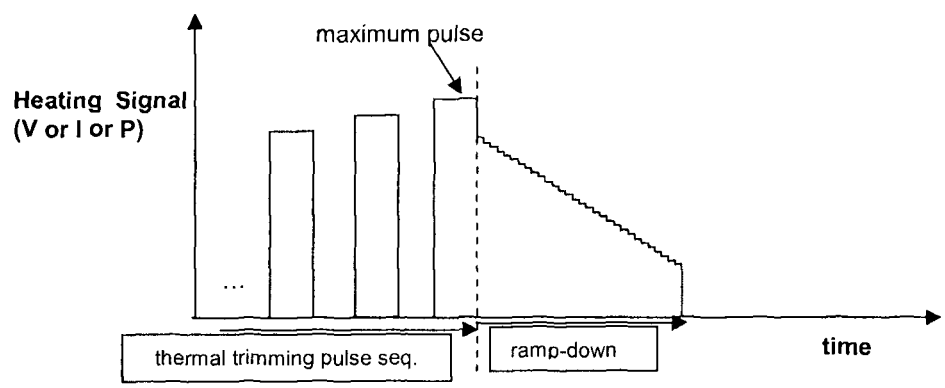
Figure 7C:
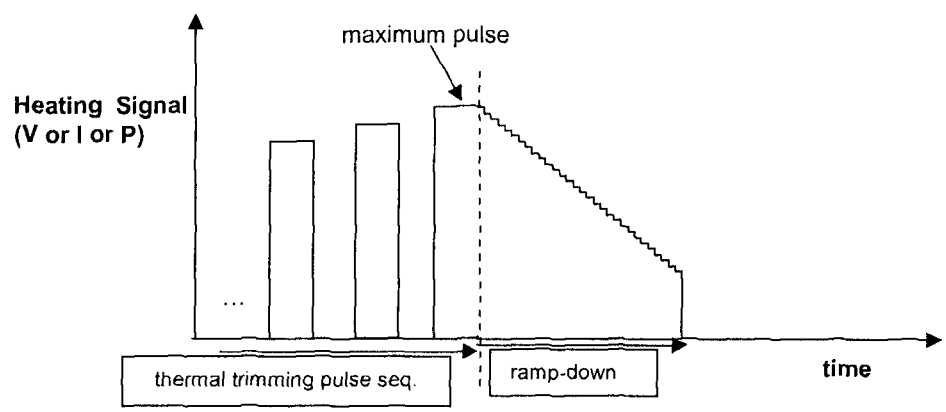

FIGS. 7a-c illustrate embodiments of heating signals comprising stepped ramp-down pulses (voltage- or current- or power-controlled), intended to implement cooling schedules, respectively. Examples of stepped, constant-cooling-rate ramp-down signals at the end of an increasing thermal-trimming heating-pulse sequence are shown as follows. FIG. 7(a): The ramp-down begins some time after the end of the last thermal trimming pulse, and at a lower magnitude than the maximum pulse. FIG. 7(b): The ramp-down begins immediately after the end of the exposure phase of the last thermal trimming pulse, and at a lower magnitude than the maximum pulse. FIG. 7(c): The ramp-down begins at the end of the exposure phase of the last thermal trimming pulse, at the same magnitude as the maximum pulse.

FIG. 7a illustrates a heating signal comprising a plurality of trimming pulses followed by a ramp-down pulse. Alternatively, the heating signal of FIG. 7a can be considered as comprising a trimming signal made of a plurality of trimming pulses and a ramp-down signal having a plurality of ramp-down pulses. FIGS. 7b and 7c illustrate embodiments of a heating signal comprising a plurality of trimming pulses followed by a trimming-with-ramp-down pulse. If the ramp-down signals depicted in FIGS. 7a-c are power-controlled, then this will implement substantially the temperature ramp-downs illustrated in FIGS. 6a-c, respectively, having substantially constant cooling rates (slopes), because the resistor temperature is most closely related to the power dissipated within the microstructure surrounding the resistor (or within the resistor itself). If the signals illustrated in FIGS. 7a-c are voltage-controlled and linearly decreasing, then the resulting temperature ramp-downs will be more upward-curving like curve 72 illustrated in FIG. 4a while still being monotonically decreasing.

In one embodiment, a ramp-down signal delivers electrical power of decreasing amplitude, dissipating power in the microstructure which decreases with time. The rate at which the dissipated power decreases is designed to prevent the temperature in the microstructure from decreasing as fast as it would without such a ramp-down signal, to intentionally slow the cooling rate. The electrical signal vs. time can be strictly decreasing-only (corresponding directly to the temperature profiles illustrated in FIG. 4, 5 or 6), or can be a pulse-width-modulated (PWM) signal designed so that the power dissipated in the resistor vs. time and the temperature vs. time are decreasing only. Alternatively, a PWM signal can also be used when the Time vs temperature is non-monotonic (i.e. not decreasing-only).

In one embodiment where a heating pulse-width-modulated signal is used, the basic pulse (modulation) period is much shorter than the characteristic thermal response time of the resistor so that the resistor temperature does not experience a rapid heating and cooling schedule of the pulse-width modulated electrical input signal.

In the case of any ramp-down signal, including a pulse-width-modulated signal, the functional thermally-adjustable resistor element itself which is thermally isolated, experiences a temperature vs. time profile that is decreasing-only, and is decreasing slowly enough to avoid the creation of large concentrations of material imperfections or degradation of post-trim resistance stability.

In one embodiment, a cooling schedule comprises a single ramp-down pulse which implies a monotonic decrease of the microstructure temperature, cooling at a substantially constant rate, starting at or near or substantially below about $T_{max}$ (the previous maximum temperature applied to the electrical component), and decreasing to a temperature (experimentally found), which is typically below $T_{th}$ (the threshold for observable thermally-induced changes in resistance). This monotonic decrease can be characterized by a cooling rate which is approximately maintained throughout the duration of the temperature ramp-down.

In one embodiment, the trimming operation is performed to adjust the resistance value of the resistor and the cooling operation according to a cooling schedule is only performed for increasing the post-trimming resistance stability. In this embodiment, the cooling operation has substantially no influence on the room temperature resistance value. The room temperature resistance value is only adjusted by the trimming operation.

In another embodiment, the cooling operation according to a cooling schedule influences the final room temperature resistance value. During thermal trimming, while the resistance may be varying in a complex manner at the elevated temperature during the trimming pulse sequence and/or cooling(s), each high-temperature excursion causes a resistance trimming effect, which can be seen by comparing the room temperature resistance before the high-temperature excursion to the room-temperature resistance after the high-temperature excursion. Consider a ramp-down from a temperature close to $T_{max}$. For typical polysilicon, at temperatures close to $T_{max}$, the resistance trimming effect is to decrease the room-temperature resistance. In other words, if the temperature ramp-down were abruptly stopped, i.e. if the temperature was returned to room-temperature, at a time-instant during the initial part of the ramp-down, the observed room-temperature resistance would be decreased compared to the room-temperature resistance which would have been observed immediately before the temperature ramp-down began.

Figure 8A:
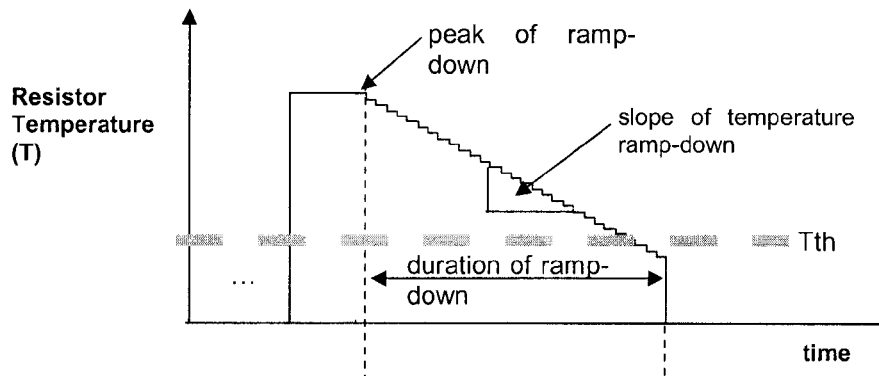
FIG. 8a illustrates an example of a stepped, constant-cooling-rate cooling schedule at the end of an increasing thermal-trimming heating-pulse sequence, identifying specific parameters—peak, slope and duration of the cooling schedule.
Figure 8B:
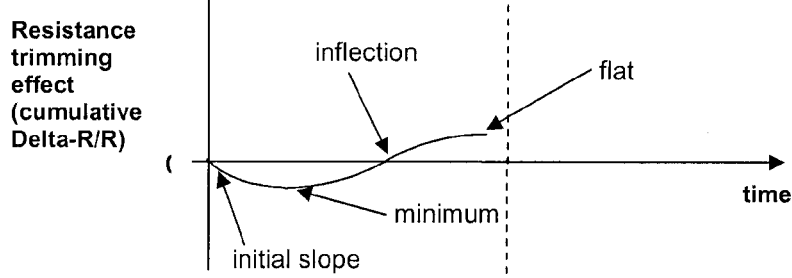
FIG. 8b illustrates an example of the resulting resistance trimming effect, (cumulative fractional change in resistance) as a function of time, as if the ramp-down were stopped at that instant in time, identifying typical features (initial slope, minimum, inflection, and flat) of the cumulative Delta-R/R, referred to the trim state at the beginning of the cooling schedule.
Figure 8C:
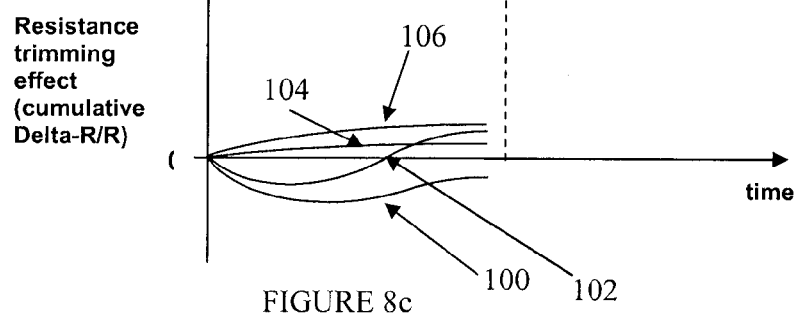
FIG. 8c illustrates several examples showing resistance trimming effects which can occur depending on the parameters of the cooling schedule.

FIGS. 8a to 8c illustrate examples as follows. FIG. 8(a): An example of a stepped, constant-cooling-rate resistance ramp-down schedule at the end of an increasing thermal-trimming heating-pulse sequence, identifying specific parameters—peak, slope and duration of the ramp-down schedule; FIG. 8(b): An example of the resulting resistance trimming effect, (cumulative fractional change in resistance) as a function of time, as if the ramp-down were stopped at that instant in time, identifying typical features (initial slope, minimum, inflection, and flat) of the cumulative Delta-R/R, referred to the trim state at the beginning of the ramp-down schedule; FIG. 8(c) Several examples showing resistance trimming effects which can occur depending on the parameters of the ramp-down schedule.

FIG. 8a illustrates the temperature of a resistor as a function of time when the resistor is first trimmed and then cooled according to a cooling schedule, in accordance with one embodiment. FIG. 8b shows an example of the resulting resistance trimming effect, i.e. the cumulative fractional change in room-temperature resistance which would have been observed if the temperature ramp-down had been abruptly stopped, i.e. returned to room temperature at that instant in time. For typical polysilicon, during the initial part of the temperature ramp-down from a temperature close to $T_{max}$, the resistance will typically be decreasing because the temperature is high. This is represented in FIG. 8b as an initial negative slope and the room-temperature resistance would be decreasing. As the temperature ramp-down in FIG. 8a progresses downward, in typical polysilicon the resistance continues to decrease, but less quickly, and goes through a minimum and begins to increase (positive slope). Eventually, there is an inflection in the curve, the positive slope lessens, and finally the resistance change approaches zero, when the temperature roughly corresponds to $T_{th}$.

FIG. 8c illustrates embodiments of resistance trimming effects which can occur in practice, depending on the parameters of the cooling schedule. The curve of cumulative Delta-R/R (difference between the actual resistance value and the initial resistance value, divided by the initial resistance value) may first decrease, then increase, or may increase-only. The final cumulative Delta-R/R due to the ramp-down may end up less than zero (see curve 100), or greater than zero (see curves 102, 104, 106), or equal to zero. These effects illustrated in FIG. 8c can be manipulated by varying the parameters of the cooling schedule (peak, slope, duration). The quantitative details of how the resistance trimming effects vary with cooling parameters can be found experimentally.

In one embodiment where the resistor is made of polysilicon, the differences between curves 100, 102, 104, and 106 can be achieved by decreasing the peak of the cooling schedule, while holding the pulse width or slope constant. In this case, curve 100 corresponds to the highest peak of the four, while curve 106 corresponds to the lowest peak of the four. In general, in typical polysilicon, whether the cumulative Delta-R/R is positive or negative can be controlled by adaptively varying the cooling parameters. For example, if a temperature ramp-down beginning at $T_{max}$ causes a decrease in room-temperature resistance, then a lower peak in the next ramp-down signal is likely to either cause a reduced amount of decrease, or even cause an increase. This is consistent with the more general notion that, for the initial part of the ramp-down, the resistance will typically be continuing to change in the same direction of resistance change as was induced by the previous $T_{max}$, and then in the latter part of the ramp-down, the resistance will typically change in the opposite direction from the direction of resistance change induced by the previous $T_{max}$.

In one embodiment, the trimming target is reached after a single temperature ramp-down operation. In another embodiment, several temperature ramp-down operations are used for reaching the target room temperature resistance value. In this case, several temperature ramp-downs or several temperature ramp-downs appended to the ends of thermal-trimming pulses are executed while adaptively changing the cooling parameters (such as peak, slope, duration, curvature, $T_{end}$).

Figure 9A:
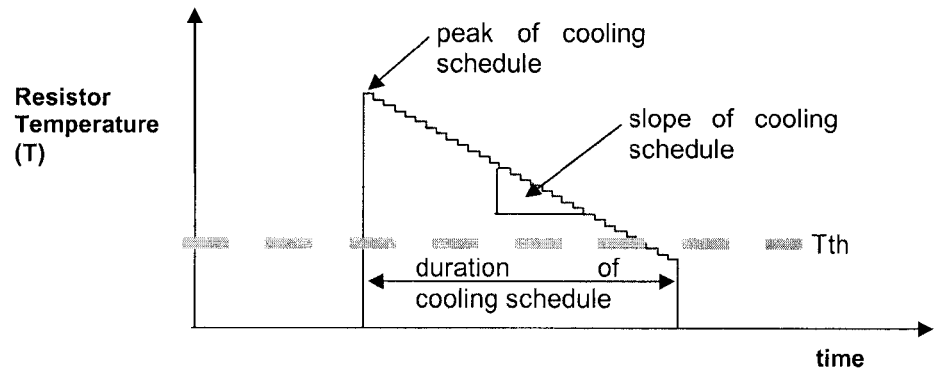
FIG. 9a illustrates an example of a stepped, constant-cooling-rate resistance cooling schedule, identifying specific cooling parameters—peak, slope and duration of the cooling schedule.
Figure 9B:
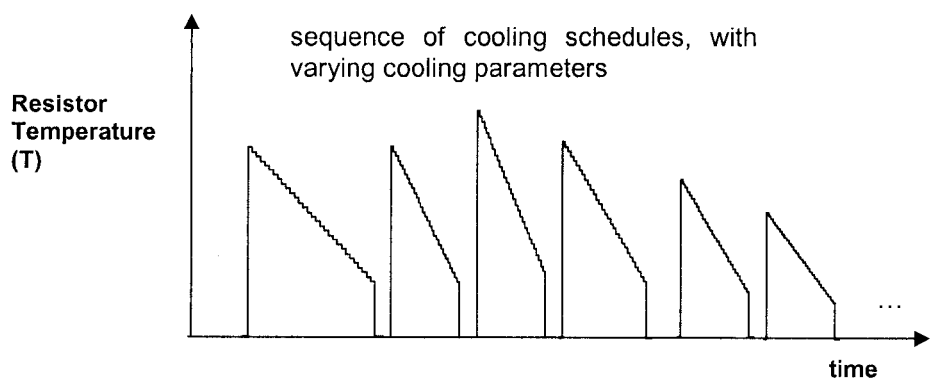
FIG. 9b illustrates an example of a sequence of stepped, constant-cooling-rate cooling schedules, having varying cooling parameters.
Figure 9C:
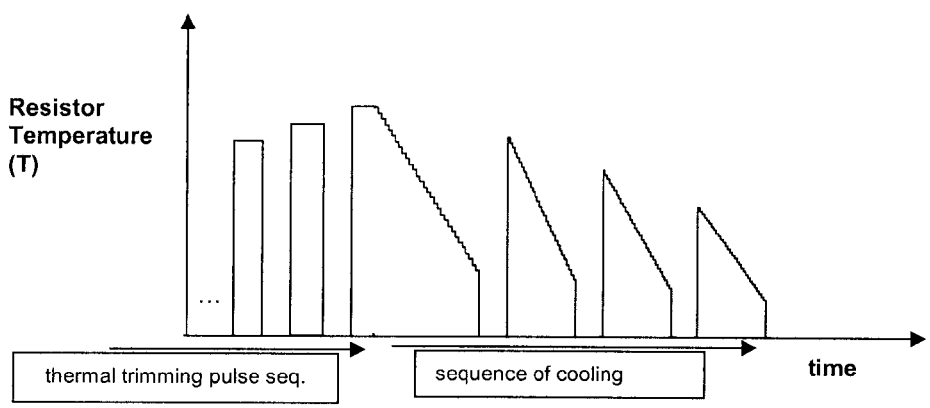
FIG. 9c illustrates an example of a mixed sequence of thermal trimming pulses, and ramp-downs, where the ramp-downs each have lower peak than the preceding ramp-down.
Figure 9D:
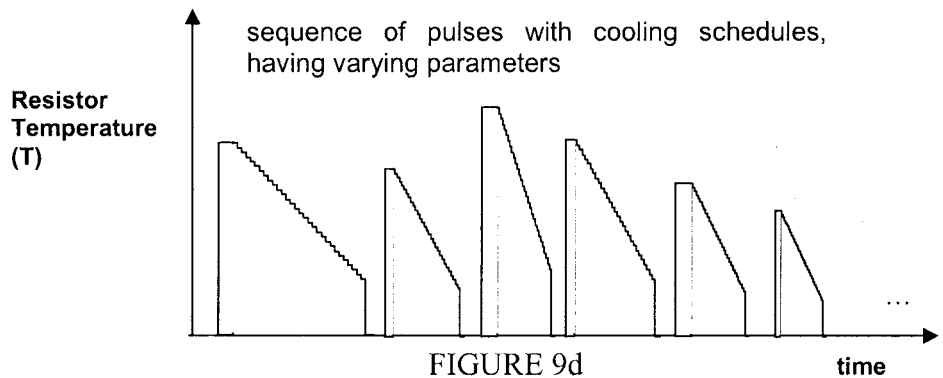
FIG. 9d illustrates an example of a sequence of pulses with stepped, constant-cooling-rate cooling schedules having varying parameters.
Figure 9E:
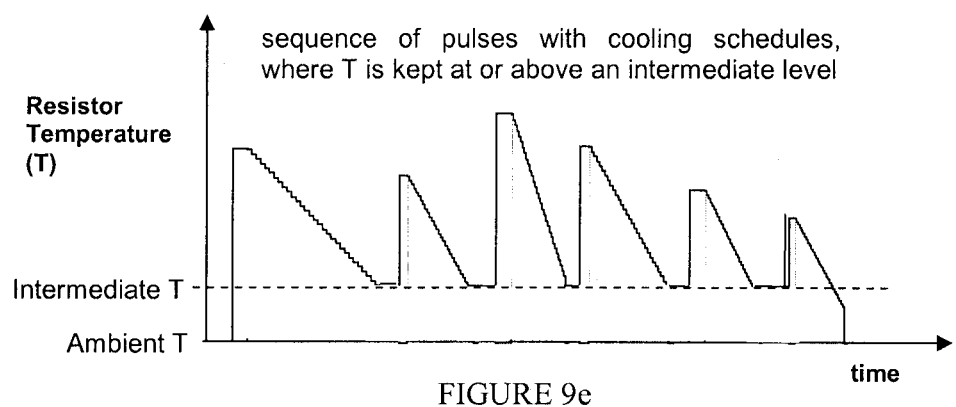
FIG. 9e illustrates an example of a sequence of pulses with stepped, constant-cooling-rate cooling schedules, where the temperature is kept at or above an intermediate level.
Figure 9F:
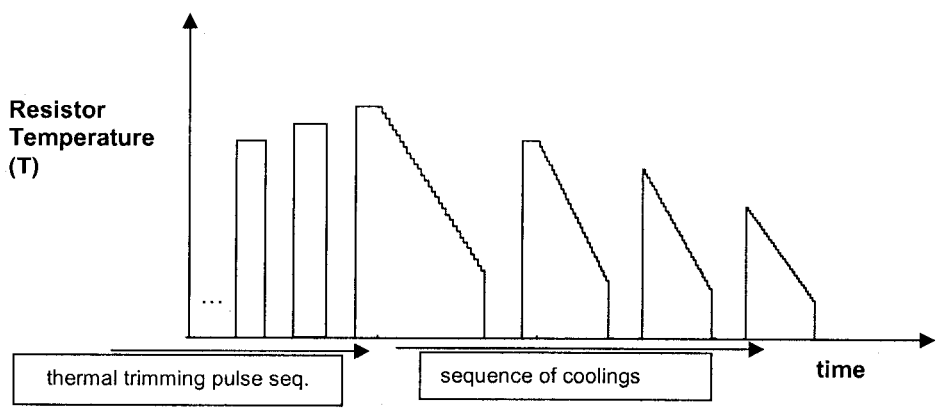
FIG. 9f illustrates an example of a mixed sequence of thermal trimming pulses, ramp-downs, and pulses with ramp-downs, where the ramp-downs each have lower peak than the preceding ramp-down.

FIGS. 9a-f illustrate different embodiments of cooling schedules which are used for adjusting the room temperature resistance value, as follows. FIG. 9(a): An example of a stepped, constant-cooling-rate resistance ramp-down schedule, identifying specific ramp-down parameters peak, slope and duration of the ramp-down schedule; FIG. 9(b): An example of a sequence of stepped, constant-cooling-rate ramp-down schedules, having varying ramp-down parameters; FIG. 9(c): An example of a mixed sequence of thermal trimming pulses and ramp-downs, where the ramp-downs each have lower peak than the preceding ramp-down; FIG. 9(d): An example of a sequence of pulses with stepped, constant-cooling-rate ramp-down schedules having varying parameters; FIG. 9(e): An example of a sequence of pulses with stepped, constant-cooling-rate ramp-down schedules, where the temperature is kept at or above an intermediate level; FIG. 9(f): An example of a mixed sequence of thermal trimming pulses, ramp-downs, and pulses with ramp-downs, where the ramp-downs each have lower peak than the preceding ramp-down.

FIG. 9a illustrates one embodiment of a single temperature ramp-down resulting from the application of a single ramp-down pulse to the electrical component. This single temperature ramp-down is used for both trimming and cooling the electrical component. FIG. 9b illustrates one embodiment of a sequence of temperature ramp-downs resulting from the application of a heating signal comprising a plurality of ramp-down pulses to the electrical component. This sequence of temperature ramp-downs is used for both trimming the resistance value of the electrical component and increasing the post-trimming resistance stability. FIG. 9d illustrates one embodiment of the temperature of the electrical component in time when a heating signal comprising a plurality of trimming-with-ramp-down pulses is applied to the electrical component. This sequence of trimming-with-ramp-down pulses are used for trimming the electrical resistance of the electrical component and controlling the cooling of the electrical component. By varying the parameters of the cooling part of each trimming-with-ramp-down pulse, the resistance value can be decreased or increased to hit a high-precision resistance target value. When using only ramp-down pulses or only trimming-with-ramp-down pulses, if at the end of any given temperature ramp-down, one finds that the target value has been reached, one can merely terminate the sequence, and still benefit from the stability-enhancing effect of the ramp-downs.

FIGS. 9c and 9f illustrate embodiments of hybrid sequences, or mixed sequences, of trimming pulses, ramp-down pulses, and trimming-with-ramp-down pulses. One may use trimming pulses when far from the target in order to save the additional time that would be consumed by ramp-downs, and then apply ramp-down pulses and/or trimming-with-ramp-down pulses, while fine-tuning the resistance to higher precision. In one embodiment, the trimming pulses are stopped somewhat above the target, then a sequence of ramp-down pulses beginning at $T_{max}$ with decreasing peaks is applied, until the target is reached or passed. The first one or more ramp-down pulses are used to adjust the resistance value (as illustrated by curve 100 in FIG. 8c). The target value may be overshot or not during this process. If the target is slightly overshot, then a ramp-down pulse with a lower peak may "recover" back to the target. Once the target has been reached, the sequence is stopped and no more pulses are applied.

FIG. 9e illustrates one embodiment of a trimming operation in which the electrical component temperature is not allowed to reach below a certain intermediate temperature throughout the sequence. It should be understood that any of the types of pulse sequences described above can be used with such an intermediate temperature. In one embodiment, the intermediate temperature is significantly above the ambient temperature in order to reduce the extent of temperature excursions experienced by the resistor. In another embodiment, the intermediate temperature is above the threshold temperature. Alternatively, the intermediate temperature can be below the threshold temperature.

In one embodiment, the present method also addresses the adaptive control of the maximum or starting temperature caused by such a ramp-down pulse, and the use of a sequence of ramp-down pulses where the maximum or starting temperature in each waveform is controlled adaptively in order to attain better resistance-adjustment precision and shorter total trimming time. A feature of a temperature ramp-down is that, if at the end of a waveform, the resistance target has been reached within a predetermined precision, then no additional step such as resistance recovery is required to stabilize the resistance. Resistance recovery corresponds to an adjustment of the resistance value when the target value has not been reached. Resistance recovery can correspond to an increase in resistance after a thermal trim-down when the resistance value is below its target, by applying a sequence of pulses having decreasing amplitude. Alternatively, resistance recovery can correspond to a decrease in resistance after a thermal trim-up when the resistance value is above its target value. Post-trim stability of the resistance is improved by long "recovery" sequences.

In one embodiment, the present method slows the cooling rate at the end of the last trimming pulse or pulses in a trimming sequence, by controlled ramp-down pulses, in order to slow the cooling rate by one or more orders of magnitude. This means deliberately slowing the microstructure cooling rate, to a significantly slower rate than would be present if the microstructure were simply allowed to cool by itself at the end of a trimming pulse. Experimental results show that the reduction of the cooling rate improves (reduces) post-trim resistance drift. For example, slowing the cooling rate from about 1E4° C./second to about 1E3° C./second, i.e. more than one order of magnitude, significantly improves drift stability, as further described below.

In one embodiment, the choice and the shape of ramp-down signal/pulse/component parameters, such as peak amplitude, slope, duration, curvature, $T_{end}$, and the like, depend on the resistor material, on film thickness, on geometry, on the demands of the application, and on the trim state, i.e. the history of thermal trimming, of the particular resistor.

In one embodiment, the present ramp-down technique is effective at reducing long-term drift and enhancing long-term drift-stability for different thermally-trimmable resistance materials such as standard-CMOS polysilicon materials comprising gate-polysilicon (e.g. a few tens of ohm/sq) and resistor-polysilicon (e.g. ~100-500 ohm/sq), as well as non-polysilicon thin-film resistance materials having sheet resistance of several hundred ohms/sq to thousands of ohm/sq, including SiCr and silicon-chromium-carbide with or without other additional elements. In addition, the method allows the principle of ramp-down signals to be used as an adaptive pulse sequence designed for high-precision thermal trimming.

Considering the case of thermal trimming of polysilicon, since it takes only a few milli-seconds (e.g. less than about 5 ms) for a thermally-isolated microstructure to cool from many hundreds of degrees-C. (e.g. about 800° C.) to near room temperature (e.g. less than about 200° C.), this corresponds to a cooling rate of faster than about 1E5° C./second. Moreover, more defects such as self-interstitials in silicon are accumulated if more quenching processes are applied. Therefore, the multiple electrical pulses, causing multiple quenching processes, will significantly enhance the concentration of point defects. This should lead to a large concentration of residual point defects (e.g. $10^{16}$ cm$^{-3}$), which may cause significant resistance instability during long-term storage or operation. Indeed, experimental results confirm that after about 1000 hours at about 150° C., which correspond to an accelerated life-testing, for polysilicon resistors which are doped with Boron or Arsenic, embedded in thermally-isolated microstructures, and thermally-trimmed downward by 0 to 40%, there are several thousand ppm of upward resistance drift-stability.

Figure 10A:
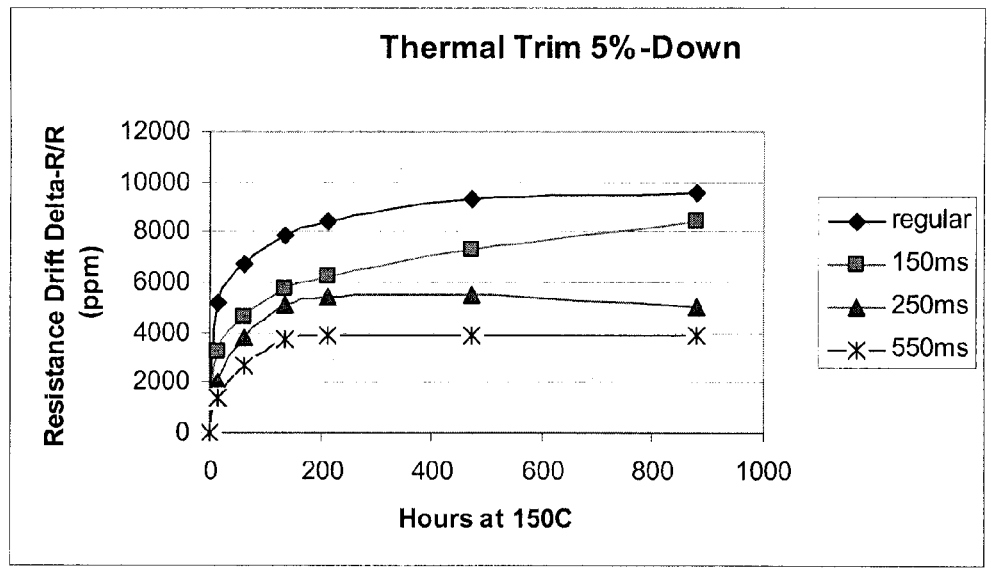
FIGS. 10a-10d show experimental measurement results of accelerated drift tests for boron-doped polysilicon functional resistors embedded within thermally-isolated microstructures.
Figure 10B:
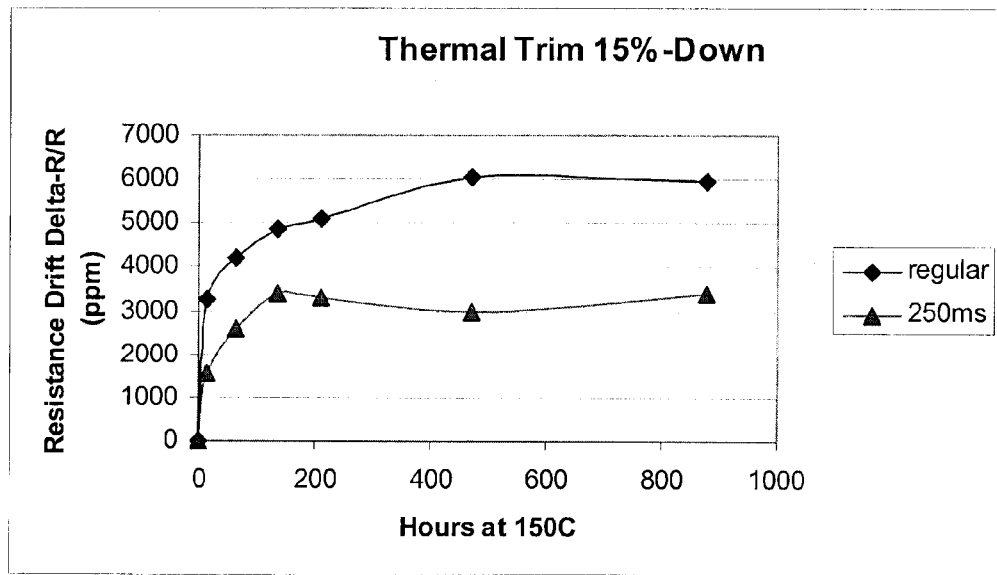
Figure 10C:
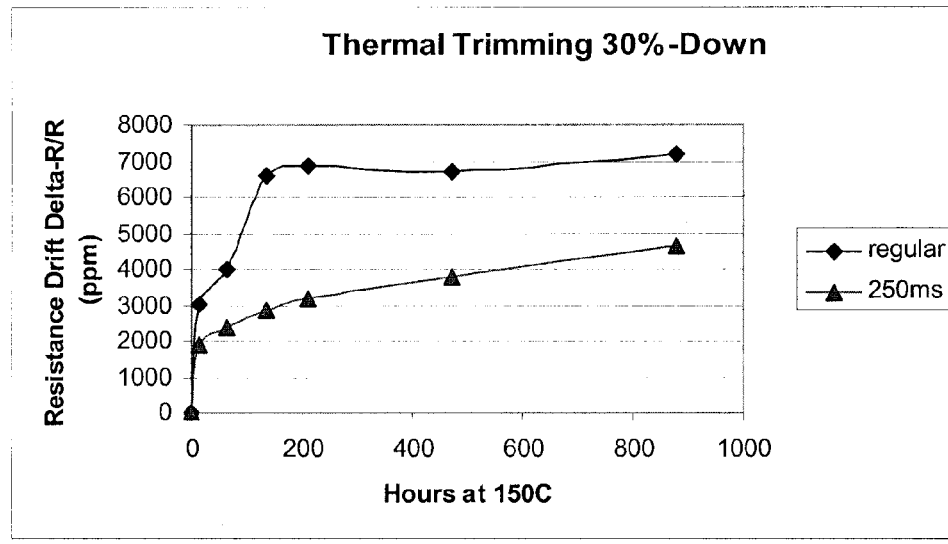
Figure 10D:
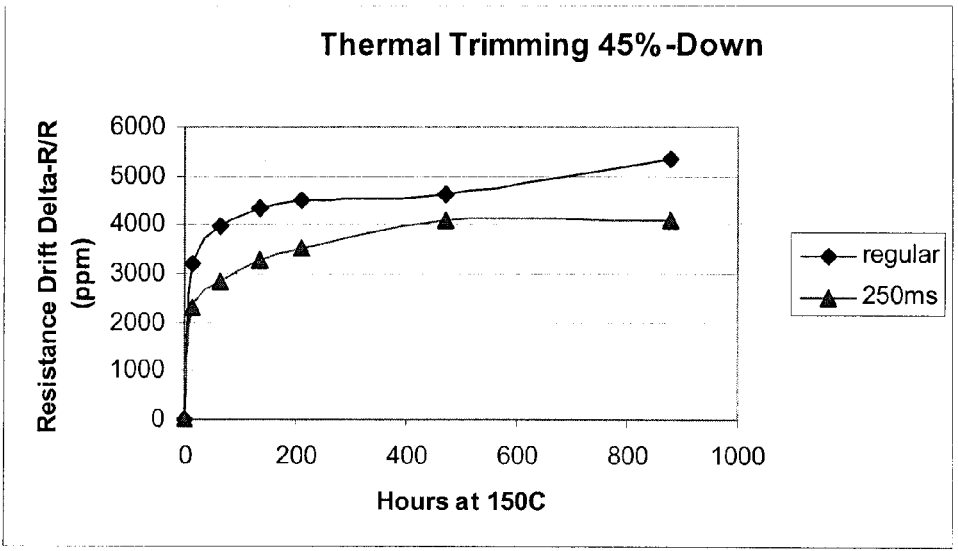
Figure 11:
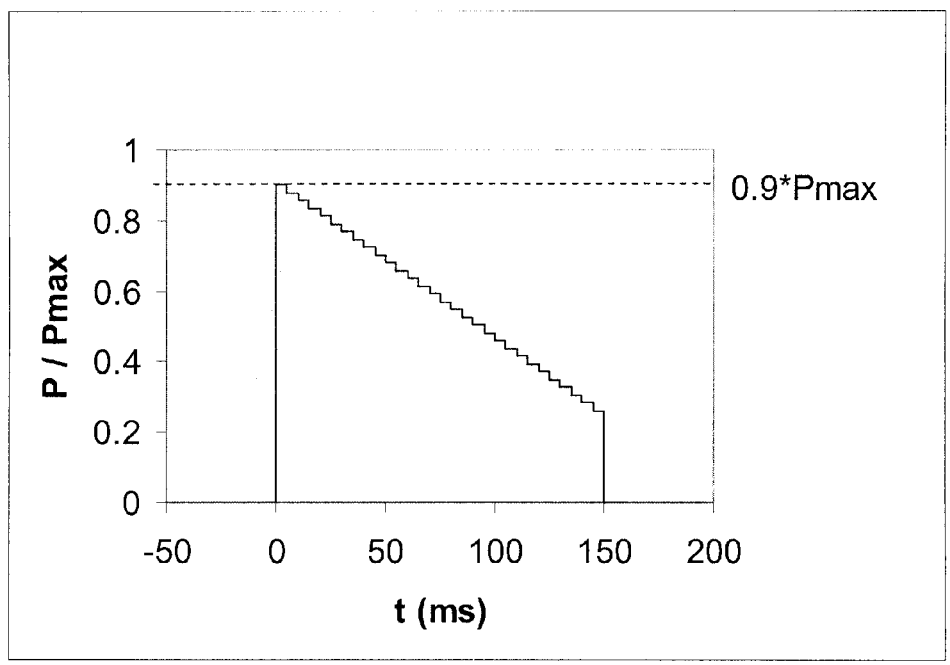
FIG. 11 shows the ramp-down signal used for the samples in FIGS. 10a-10d, in accordance with embodiments.

FIGS. 10a-10d illustrate experimental measurement results of accelerated drift tests which consist in prolonged exposure to about 150° C. for up to about 800 hours. These tests have been performed on boron-implanted (approximately on the order of $10^{20}$/cm$^3$) polysilicon functional resistors embedded within thermally-isolated microstructures. Each functional resistor was thermally-trimmed down from its as-manufactured resistance by some percentage, using a power-controlled thermal trimming pulse sequence (such as those described in WO2004/097859 and WO2007/085095, the contents of which are hereby incorporated by reference) prior to about 150° C. exposure. The "Regular" curves refer to the case where no intentional cooling schedules are applied, i.e. where the cooling is only determined by the thermal isolation and thermal mass of the microstructure which is determined by the material properties and geometrical features of the microstructure and its surroundings. The other curves are labeled according to the length of time of the intentional temperature ramp-down. As illustrated in FIG. 11, the ramp-down signal begins at 90% of the previous $P_{max}$ which was applied at the last pulse of the thermal trimming pulse sequence. $P_{max}$ is a property of the power-controlled thermal trimming pulse sequence which causes the temperature of the resistor to be substantially equal to $T_{max}$. FIGS. 10a-10d illustrate that at each trim-down percentage, there is a reduction in the long-term resistance drift, when the ramp-down waveform is used at the end of the thermal trimming pulse sequence. FIG. 10a further illustrates the effect of the duration of the temperature ramp-down. This effect is consistent with the principle that longer ramp-downs, i.e. slower cooling rates, may cause improved drift.

The ramp-down pulse used for the samples in FIGS. 10a-10d is illustrated in FIG. 11. Within the ramp-down pulse, steps of about 5 ms length are applied, without returning to zero between each step. The overall cooling time used in these ramp-downs is about 100 ms or longer, corresponding to a cooling rate of about $10^{4°}$ C./second or slower. For the specific microstructures described above, having thermal isolation of about 50 K/mW and thermal mass of about $10^{-8}$ to about $10^{-7}$ J/K, a deliberate cooling rate of about $10^{4°}$ C./second or slower provides significant improvement with respect to the "passive" cooling rate determined by the thermal time constant.

In one embodiment, the resistance continues to change in the same direction of the resistance change that was induced by the previous $T_{max}$, for most or all of the temperature ramp-down. This is the case for some non-polysilicon thin-film resistor materials. A "forward" direction of thermal trimming is defined as the direction (increase or decrease) which would normally be occurring, as caused by typical trimming pulse sequences with increasing pulse-amplitudes. "Recovery" then corresponds to the resistance change in the opposite direction from the "forward" direction. For example, for typical polysilicon, thermal trimming induces resistance decrease (the "forward" direction). In this case, resistance increase would be "recovery". However, for some other materials, or indeed even some variants of polysilicon, after an initial trim-down range, the resistance may instead increase, and may even increase above the initial as-manufactured resistance. In this case, the "forward" direction is defined to be whatever direction the resistance is changing at that stage in the trimming sequence. This type of behaviour ("forward" direction changing from resistance-decrease to resistance-increase) has also been found in certain polysilicon variants having higher sheet resistance (such as 1000 ohm/sq or higher).

In one embodiment, for some variants of non-polysilicon resistive thin films, the thermal trimming behavior, and therefore the thermal trimming pulses for this material are different from that of typical polysilicon. For some variants of non-polysilicon thin resistive films, "recovery" is substantially zero, using decreasing pulse amplitudes. In such cases, typical recovery pulse-sequences do not cause the resistance to move significantly in the "reverse" direction. In such cases, the bidirectional "resistance trimming effect" as illustrated by curves 100 and 102 in FIG. 8c would not apply. Pulse sequences of increasing amplitude make the resistance change in the "forward" direction, while pulse sequences of decreasing amplitude make the resistance continue to change in the "forward" direction, but at a reduced rate.

In one embodiment, some films demonstrate small "recovery" while the "forward" direction is resistance-decrease, but then have no "recovery" once the "forward" direction switches to resistance-increase, including resistance-increase above the original as-manufactured resistance.

It should be understood that for materials or films which offer substantially no recovery or little recovery, the resistance target should not be overshot in order to achieve a high-precision target. This can be achieved by lowering the trimming pulse amplitude sufficiently before reaching the target in order to maintain control of the trimming rate before overshooting the target. Similarly, in order to attain enhanced post-trim stability, ramp-downs should be applied sufficiently before reaching the resistance target. In one embodiment, ramp-downs are applied as soon as the trimming signal amplitude is decreased. In this case, sequences of the types depicted illustrated in FIGS. 9c and 9f, or possibly in FIGS. 9b, 9d, and 9e, can be applied.

In one embodiment where substantially no "recovery" can be performed, the adjustment target is anticipated early enough to reduce the trimming pulse amplitudes in order to not overshoot the target, particularly if one wants to use ramp-down signals to improve post-trim stability. Since the ramp-down itself makes the resistance continue to change in the "forward" direction, the last trimming pulse and ramp-down are anticipated and planned ahead before reaching the target. In this case, it may be useful to apply a ramp-down at the end of each of the last few trimming pulses (i.e. use trimming-with-ramp-down pulses), for at least two reasons:

(a) if the resistance is already substantially at the target after a trimming-with-ramp-down pulse, then the resistance stability is suitably improved; and (b) if the resistance has not reached the target yet after a trimming-with-ramp-down pulse, but is close enough that the trimming pulse amplitude needs to be reduced compared to the previous maximum pulse power, then the material imperfections caused by the previous highest temperature will have been already "healed" (annealed) by a ramp-down. This would be now substantially impossible to accomplish using a pulse of reduced amplitude.

Figure 12:
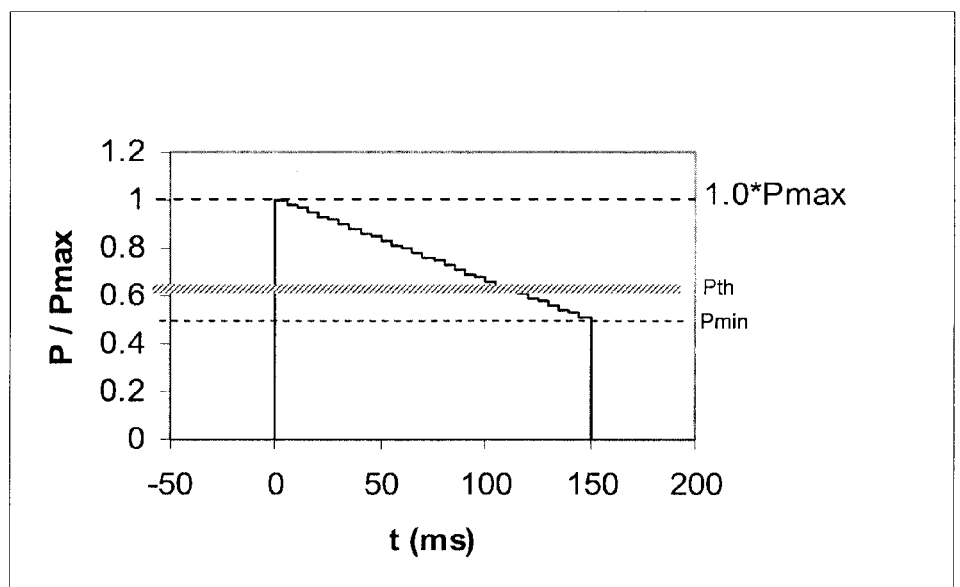
FIG. 12 shows the ramp-down signal used at the end of the last trimming pulses to improve stability of non-polysilicon thin film material, film-A and film-B, in accordance with embodiments.

FIGS. 12 to 14 illustrate the resistance drift for two different variants of non-polysilicon thin resistive films, called "film-A" and "film-B", having little-or-no "recovery". It should be understood that these examples are exemplary only and do not limit the applicability of the present method to these variants of non-polysilicon thin film materials. These examples are rather used to better illustrate the behavior of the materials and the applicability of the described method.

In one embodiment, unlike typical polysilicon, the trimming behavior of film-A and film-B exhibits several distinct phases. Beginning at the as-manufactured or untrimmed resistance and Temperature Coefficient of Resistance (TCR), the resistance is first trimmed in a decreasing direction, and the TCR increases. The as-manufactured TCR is about a few tens of ppm/K below 0 ppm/K. In this stage, the "forward" direction is "decrease". Then, after a significant trim-down of about 10% to about 30% which corresponds to an increase in TCR of about +50 ppm/K to about +500 ppm/K, the resistance trimming changes direction so that the "forward" trimming direction becomes "increase". The TCR continues to increase, through this change-of-direction. As the resistance reaches substantially the original as-manufactured resistance value, the TCR becomes more constant. As the resistance increases far above the original as-manufactured resistance value, the TCR begins to decrease somewhat. The "forward" trimming direction is still "increase". FIG. 12 illustrates one embodiment of a ramp-down signal used for enhancing the resistance stability of the non-polysilicon film-A and film-B in the experiments illustrated in FIGS. 13a-d and FIGS. 14a-c discussed below. As illustrated in FIG. 12, the ramp-down starts at $P_{max}$ instead of $0.9*P_{max}$, and stops at $\sim 0.5*P_{max}$. Many variations of ramp-down signals (starting $P/P_{max}$, $P_{min}$, time-period, step size, step length) are possible. In this embodiment, the waveform is applied directly following at the end of the last (max) "forward" pulse which means that the temperature is not brought down to zero between the last (max) "forward" pulse and the beginning of the ramp-down waveform.

FIGS. 13a-d illustrate measurements addressing the resistance stability of thermally-trimmed samples of film-A described above, having sheet resistance of about several hundred ohms/sq (about 500 ohm/sq). FIGS. 13a-d compare the stabilities of thermal trims when no temperature ramp-down is applied (i.e. the "regular" curves) and when the temperature ramp-down illustrated in FIG. 11 is applied, for four different trim-states, namely when the film-A is: (a) trimmed-down of a about 3%; (b) trimmed-down of about 15%; (c) trimmed-down of about 24% (which corresponds to the point of change-of-direction, where TCR is now between about +300 ppm/K and about +400 ppm/K); (d) trimmed back up to the as-manufactured resistance (0%-down, after 24%-down, and now having TCR several hundred ppm/K higher than the as-manufactured TCR). In all illustrated trim-states (a) to (d), the magnitude of the post-trim resistance drift after many hours at 150° C. is substantially reduced due to intentional ramp-downs. Note that in FIGS. 13a, 13b, and 13c, the resistance drift after more than 250 hours is less than 300 ppm.

If a thermally-isolated resistor has been thermally trimmed, the resistivity has typically changed as a function of its position within its thermally-isolated microstructure. Usually, the most thermally-isolated positions with the microstructure will experience the highest thermal-trimming temperatures and therefore, are likely to have the largest resistivity change from the as-deposited resistivity, which is presumed to be relatively constant with position, since the deposition is assumed to be homogeneous. The resistivity as a function of position within the microstructure can be evaluated by material analysis techniques, which are known to those skilled in the art. Therefore, it is possible to determine if a thermally-isolated resistor has been thermally-trimmed. It is also possible to test its stability, such as for example by applying a certain amount of heat to it over an extended period of time. In accordance with an embodiment of the present method for stabilizing a post-thermal-trimming resistance of a thermally isolated electrical component made from a thermally mutable material, a thermally-trimmed, thermally-isolated, thin-film resistor having a stability defined by resistance drift less than about 300 parts per million after more than about 250 hours at about 150° C. is achievable. Other levels of stability will also be feasible, as will be understood by those skilled in the art.

FIGS. 14a-c illustrate measurements addressing the stability of thermally-trimmed samples of film-B described above, having sheet resistance of about 4 times larger than film-A, which corresponds to a thickness about four times smaller than film-A. FIGS. 14a-c compare the resistance stabilities of thermal trims when no ramp-down is applied (i.e. the "regular" curves) and when the temperature ramp-down illustrated in FIG. 12 is applied, for three different trim-states, namely when film-B is: (a) trimmed-down of about 2%; (b) trimmed-down of about 5%; (c) trimmed-down of about 13% which corresponds to the point of change-of-direction, where TCR is now between about +100 ppm/K and about +200 ppm/K. In all illustrated trim-states (a) to (c), the magnitude of post-trim resistance drift after many hours at about 150° C. is substantially reduced due to intentional ramp-downs.

In one embodiment, a ramp-down signal is done in a power-controlled mode, however it can also be done in voltage-controlled or current-controlled mode. Since the microstructure temperature is roughly linearly related to the power dissipated within the microstructure, power-controlled ramp-down waveforms may make it easier to obtain a linearly decreasing temperature. In voltage-controlled ramp-down waveforms, since the power varies as the square of the voltage, the power dissipated within the microstructure would decrease in a non-linear manner.

In one embodiment, the method comprises intentionally reducing the cooling rate in order to enhance post-trim stability using at least one ramp-down waveform. This is useful for all thermally-mutable materials whose post-adjustment stability is negatively affected by rapid quenching.

In one embodiment, the method comprises applying the technique while still obtaining high precision adjustment. This may depend on the material in question and involves using one or more ramp-down waveforms within a sequence of heating pulses for thermal adjustment. For polysilicon, this means changing an initial $T_{max}$ for the waveform to go "forward" or "recover". By sufficiently reducing the maximum temperature, the effect of the waveform can increase the resistance value. These are like "recovery" ramp-down waveforms. Indeed, one can use ramp-down waveforms throughout the adjustment pulse sequence by replacing each "pulse" in the sequence by a ramp-down waveform or a pulse-and-ramp-down waveform. This method can be applied to polysilicon materials which allow "recovery".

In another embodiment, for materials which do not "recover" or do not "recover" enough to overcome typical overshoot during the thermal trimming procedure, at least one ramp-down waveform is applied early enough before the final resistance target, in order to avoid overshooting while still maintaining stability. The sequences illustrated in FIG. 9c, 9f or 9b, 9d, and 9e, can be useful in this situation. This method can be applied to some non-polysilicon thin-film resistive materials. This type of regime also applies to certain ranges of thermal adjustment of polysilicon, such as for very small adjustments down from the as-manufactured resistance, where the "recovery" range is very small or non-existent. It should be understood that the overshoot may be caused by any of several different types of reasons other than material properties such as equipment, instrumentation logistics, and the like.

In a further embodiment, the method takes into account a total trimming and cooling time. A tradeoff is found between the total time, the adjustment precision, and the resistance stability. This embodiment addresses the tradeoff between stability enhancement and time allowed for the ramp-down waveform. An ideal ramp-down waveform would deliver cooling at a very slow rate, which allows the material to reach a steady-state of internal physical processes at each temperature as it cools. The time required for such an ideal scenario is practically prohibitive (e.g. minutes to weeks). Without changing $T_{max}$, one experimentally determines the initial rate of cooling, $CR_{initial}$, depending on the acceptable stability. Also, one experimentally determines whether it is important to reduce the cooling rate further, (slower than $CR_{initial}$) as the ramp-down waveform progresses (making the ramp-down waveform have a positive curvature with time), in order to make the latter part of the waveform more effective to improve stability. Note that waveforms with negative curvature with time are likely to be less effective because physical processes tend to be faster at higher temperatures. Also, one experimentally determines the $T_{min}$ which the ramp-down waveform will reach, using the experimental criterion that at temperatures below $T_{min}$, improvements to stability are too insignificant to be considered, or it would require an impractically long time to realize significant improvements to stability. This $T_{min}$ is typically below $T_{th}$, the temperature at which observable resistance changes occur. If one is far from the adjustment target, one may first use rectangular pulse sequences (such as those described in WO2004/097859), to approach the target at maximum speed, and then apply one or more ramp-down waveforms when closer to the target.

Figure 15:
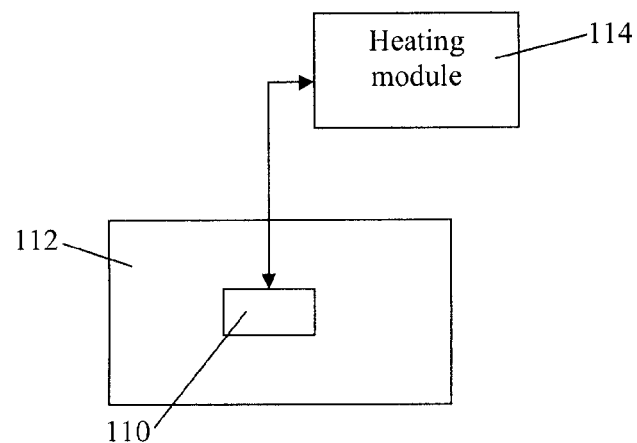
FIG. 15 is a block diagram of an apparatus for trimming a parameter of an electrical component, in accordance with an embodiment.

FIG. 15 illustrates one embodiment of a system for stabilizing a post-trimming resistance of an electrical component 110 made of a thermally trimmable material. The system comprises a substrate 112 and heating circuitry comprising a heating module 114. The substrate 112 comprises a thermally isolated region on which the electrical component 110 is positioned. The heating module 114 is in heat transfer communication with the electrical component 110. The heating module 114 is used for heating the electrical component 110 to a trimming temperature and for controlling the cooling of the electrical component 110 according to the method previously described.

In one embodiment, the heating module 114 is adapted to dynamically set the cooling schedule.

In one embodiment, the heating module 114 is adapted to generate and apply a heating signal to the electrical component 110 in accordance with the methods previously described. In another embodiment, the system further comprises a heating device, such as an auxiliary resistor, which is in heat transfer communication with the electrical component 110. The heating module 114 is connected to the heating device and applies the heating signal to the heating device in order to trim the parameter of the electrical component 110.

In one embodiment, the trimming apparatus comprises sensing circuitry for sensing parameters of the electrical component 110 and the temperature of the electrical component is determined using the sensed parameters.

Figure 16:
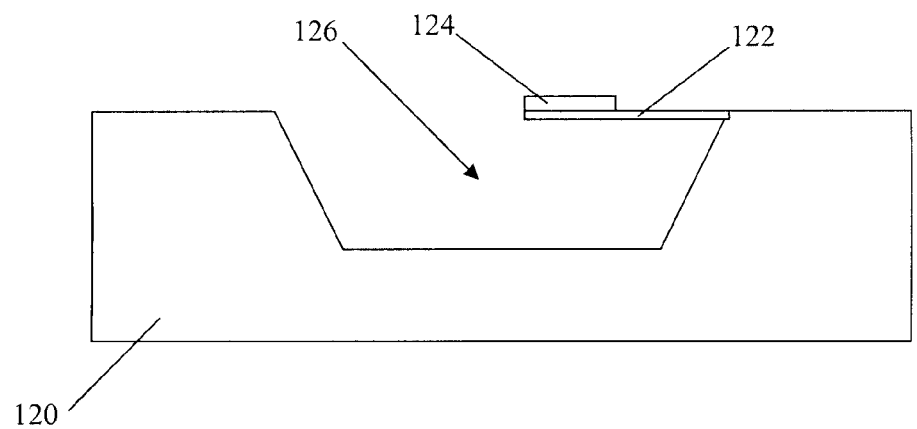
FIG. 16 illustrates a substrate having a thermally isolating region, in accordance with an embodiment.

FIG. 16 illustrates one embodiment of a substrate 120 having a thermally isolated region. The substrate 120 comprises a microstructure 122 on which an electrical component 124 to be trimmed is positioned. A cavity 126 located underneath the microstructure 122 allows the thermal isolation of the electrical component 124.

It should be understood that other assembly allowing the thermal isolation of the electrical component to be trimmed can be used.

It should be noted that the previous graphs illustrated in the figures are exemplary only and are not necessary to scale. The purpose of these graphs is to illustrate the method for stabilizing a post-trimming resistance of a thermally isolated electrical component.

The embodiment(s) of the invention described above is(are) intended to be exemplary only. The scope of the invention is therefore intended to be limited solely by the scope of the appended claims.

We claim:

1. A method for stabilizing a post-thermal-trimming resistance of a thermally isolated resistor made from a thermally mutable material, the method comprising:
    generating at least one heating signal, each one of said at least one heating signal having an initial amplitude corresponding to an annealing temperature, a slope corresponding to a given cooling rate and a duration corresponding to a given cooling time; and applying said at least one heating signal to one of said thermally isolated resistor and a heating device in heat transfer communication with said thermally isolated resistor, after a trimming process, in order to cause said resistor to cool gradually in response to each of said at least one heating signal and in accordance with said given cooling rate, said given cooling rate being slower than a passive cooling rate determined by a natural thermal time constant associated with the thermal isolation and thermal inertia of the resistor.

2. The method of claim 1, wherein said generating at least one heating signal comprises generating a stepped waveform.

3. The method of claim 1, wherein said generating at least one heating signal comprises generating a single heating pulse having a monotonically decreasing slope.

4. The method of claim 1, wherein said applying said at least one heating signal comprises causing a monotonic decrease in temperature of said resistor.

5. The method of claim 1, wherein said generating at least one heating signal comprises generating said at least one heating signal with said slope corresponding to a constant cooling rate.

6. The method of claim 1, wherein said generating at least one heating signal comprises generating a plurality of heating pulses with varying slopes.

7. The method of claim 1, wherein said generating at least one heating signal comprises generating a plurality of heating pulses with varying durations.

8. The method of claim 1, wherein said generating at least one heating signal comprises generating a plurality of heating pulses with varying amplitudes.

9. The method of claim 1, wherein said generating at least one heating signal comprises generating said at least one heating signal with a trimming effect.

10. The method of claim 9, wherein said generating at least one heating signal comprises taking said trimming effect into account when selecting parameters of said at least one heating signal.

11. The method of claim 9, wherein said applying said at least one heating signal comprises trimming said resistor in a forward direction while cooling according to said given cooling rate.

12. The method of claim 9, wherein said applying said at least one heating signal comprises trimming said resistor in a reverse direction while cooling according to said given cooling rate.

13. The method of claim 9, wherein said applying said at least one heating signal comprises initially trimming said resistor in a forward direction and then in a reverse direction, while cooling according to said given cooling rate.

14. The method of claim 1, wherein said applying said at least one heating signal comprises applying said at least one heating signal a predetermined amount of time after a last trimming pulse of said trimming process.

15. The method of claim 14, wherein said generating at least one heating signal comprises generating said at least one heating signal with said amplitude less than an amplitude of said last trimming pulse.

16. The method of claim 14, wherein said generating at least one heating signal comprises generating said at least one heating signal with said amplitude equal to an amplitude of said last trimming pulse.

17. The method of claim 1, wherein said applying said at least one heating signal comprises applying said at least one heating signal immediately after a last trimming pulse of said trimming process.

18. The method of claim 1, wherein said generating at least one heating signal comprises generating said at least one heating signal with said duration chosen to result in a temperature of said resistor below a trimming threshold.

19. The method of claim 1, wherein said generating at least one heating signal comprises generating said at least one heating signal with said duration chosen to result in a temperature of said resistor corresponding to an ambient temperature.

20. The method of claim 1, wherein said generating at least one heating signal comprises generating said at least one heating signal with said duration chosen to result in a temperature of said resistor corresponding to a trimming threshold.

21. The method of claim 1, wherein said generating at least one heating signal comprises generating a plurality of heating pulses with varying initial amplitudes.

22. The method of claim 1, wherein said applying comprises applying the at least one heating signal to said resistor embedded in a microstructure suspended over a cavity.

23. The method of claim 1, wherein said generating at least one heating signal comprises generating a power-controlled heating signal.

24. A method for stabilizing a post-thermal-trimming resistance of a thermally-isolated resistor made from thermally mutable material, the method comprising heating said resistor during a cooling phase after a thermal trimming process in order to cause the temperature of said resistor to gradually decrease in accordance with a cooling rate which is slower than a passive cooling rate determined by a natural thermal time constant associated with the thermal isolation and thermal inertia of said resistor, said heating comprising applying at least one heating signal to said resistor, each one of the at least one heating signal having a slope corresponding to the cooling rate.

25. A thermally-trimmed, thermally-isolated, thin-film resistor having a stability defined by resistance drift less than about 300 parts per million after more than about 250 hours at about 150° C., the resistor thermally trimmed such that the temperature of said resistor is gradually decreased in accordance with a cooling rate which is slower than a passive cooling rate determined by a natural thermal time constant associated with the thermal isolation and thermal inertia of said resistor, the resistor thermally trimmed by applying thereto at least one heating signal, each one of the at least one heating signal having a slope corresponding to the cooling rate.

* * * * *